(12) United States Patent
Yamazaki

(10) Patent No.: US 6,573,533 B1
(45) Date of Patent: Jun. 3, 2003

(54) SEMICONDUCTOR DEVICE, SEMICONDUCTOR GATE ARRAY, ELECTRO-OPTICAL DEVICE, AND ELECTRONIC EQUIPMENT

(75) Inventor: Yasushi Yamazaki, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/613,771

(22) Filed: Jul. 11, 2000

(30) Foreign Application Priority Data

Jul. 16, 1999 (JP) ............................................. 11-203631
Mar. 28, 2000 (JP) ........................................ 2000-089579

(51) Int. Cl.[7] ..................... H01L 29/04; H01L 31/036
(52) U.S. Cl. ..................... 257/72; 257/349; 257/354
(58) Field of Search .......................... 257/72, 349, 354

(56) References Cited

U.S. PATENT DOCUMENTS

| | | | |
|---|---|---|---|
| 4,791,464 A | * 12/1988 | Ipri et al. ..................... 257/354 |
| 4,809,056 A | * 2/1989 | Shirato et al. ............... 257/347 |
| 5,001,528 A | * 3/1991 | Bahraman ..................... 257/352 |
| 5,026,656 A | * 6/1991 | Matloubian et al. ......... 438/164 |
| 5,079,605 A | * 1/1992 | Blake ........................... 257/347 |
| 5,293,052 A | * 3/1994 | Cherne et al. ............... 257/349 |
| H1435 H | * 5/1995 | Cherne et al. ............... 257/347 |
| 6,124,613 A | * 9/2000 | Kokubun ....................... 257/347 |
| 6,288,412 B1 | * 9/2001 | Hamada et al. ............... 257/59 |
| 6,288,425 B1 | * 9/2001 | Adan ........................... 257/347 |

FOREIGN PATENT DOCUMENTS

| | | | |
|---|---|---|---|
| JP | 363278273 | * 11/1988 | .................. 257/354 |
| JP | 9-246562 | 9/1997 | |
| JP | 11-135795 A | 5/1999 | |

* cited by examiner

Primary Examiner—Eddie Lee
Assistant Examiner—Paul E Brock, II
(74) Attorney, Agent, or Firm—Oliff & Berridge, PLC

(57) ABSTRACT

A structure is provided which suppresses a parasitic bipolar effect without decreasing the breakdown voltage at the junctions between the excessive carrier extracting region and source/drain regions of a MOS transistor for a voltage of approximately 15 volts in a semiconductor device formed on a semiconductor layer on an insulating layer. In the MOS transistor having a source tied body structure, a semiconductor regions having a low impurity concentration is formed between a regions for extracting excessive carriers and source/drain regions. Thus, the breakdown voltage at the junctions between the extracting regions and the source/drain regions is increased and a parasitic bipolar effect is suppressed without breakdown between the extracting regions and the source/drain regions.

20 Claims, 14 Drawing Sheets

SEMICONDUCTOR DEVICE, SEMICONDUCTOR GATE ARRAY, ELECTRO-OPTICAL DEVICE, AND ELECTRONIC EQUIPMENT

BACKGROUND OF THE INVENTION

1. Field of Invention

The present invention relates to semiconductor devices, and particularly to a semiconductor device which is provided with MOS transistors formed on a semiconductor layer on an insulating layer and which can prevent supporting substrate stray effects.

2. Description of Related Art

A silicon-on-insulator (SOI) technology, which includes forming a semiconductor layer of single-crystal silicon on an insulator and forming semiconductor devices such as transistor devices on the semiconductor layer, has advantages, such as high-speed device operation, reduced electrical power consumption, and high integration density, and may be applied to electro-optical devices, such as liquid crystal devices.

In typical bulk semiconductor components, a channel region of a MOS transistor is maintained at a predetermined potential by an underlying supporting substrate. Thus, a parasitic bipolar effect due to a change in potential of the channel region does not cause deterioration of electrical characteristics, such as breakdown voltage of the device.

In a MOS transistor having an SOI structure, however, a channel bottom section is completely separated by an underlying insulating film. Thus, the channel region cannot be maintained at a predetermined potential, and is in an electrically straying state. In such a state, excessive carriers are accumulated in the channel bottom section in which the excessive carriers are generated by impact ionization due to collision of carriers accelerated in an electric field in the vicinity of a drain region with crystal lattices. When the channel potential increases by the accumulation of the excessive carriers in the channel bottom section, the NPN structure (in the case of N-channel type) of the source/channel/drain operates as an apparent bipolar device and yields an extraordinary current which causes deterioration of the breakdown voltage between the source and the drain, and thus, deterioration of electrical characteristics of the device. A series of phenomena caused by an electrical straying state of the channel region is called a supporting substrate stray effect.

A conventional method for suppressing the supporting substrate stray effect is providing a body contact region which is electrically connected to the channel region via a predetermined path in order to extract the excessive carriers in the channel region from the body contact region.

A semiconductor device including MOS transistors of an SOI structure having such a body contact region is disclosed in Japanese Unexamined Patent Application Publication No. 9-246562 (hereinafter Citation 1).

SUMMARY OF THE INVENTION

In a medium-breakdown-voltage MOS transistor used at approximately 15 volts in electro-optical devices such as liquid crystal devices, a semiconductor gate array including a plurality of the medium-breakdown-voltage MOS transistors, and a semiconductor device including a plurality of the medium-breakdown-voltage MOS transistors connected to each other in series, a high drain electric field generates a large amount of excessive carriers. Effective extraction of the excessive carriers is performed by increasing the impurity concentration in the extraction region to decrease the resistance of the extraction region. When the impurity concentration is increased in the structure of the Citation 1, the PN junctions between the extraction region and source/drain regions cannot withstand a high drive voltage.

It is an object of the present invention, for at least solving the above problems, to provide a semiconductor device provided with a MOS transistor formed on a semiconductor layer on an insulating layer which has junctions between the extraction region and the source/drain regions exhibiting a high breakdown voltage.

It is another object of the present invention to provide a semiconductor gate array including a plurality of the MOS transistors arranged on the semiconductor layer on the insulating layer.

It is another object of the present invention to provide a semiconductor device including a plurality of the MOS transistors which are formed on the semiconductor layer on the insulating layer and are connected to each other in series.

In an exemplary embodiment of the present invention, a semiconductor device preferably consists of a supporting substrate having insulation at least at a surface thereof, a semiconductor layer formed on the surface of the supporting substrate, and a MOS transistor formed in the semiconductor layer. The MOS transistor preferably consists of a channel region of a first conductive type formed on the surface of the supporting substrate, a source region and a drain region of a second conductive type formed on the surface of the supporting substrate so as to sandwich the channel region, an second insulating layer formed on the channel region, and an electrode formed on the insulating layer. The semiconductor device may further consist of a first semiconductor region provided on the surface of the supporting substrate at least at one end in the channel width direction of at least one of the source region and the drain region along the channel length direction, and a second semiconductor region of the first conductive type provided on the surface of the supporting substrate so as to sandwich the first semiconductor region by the source region or the drain region along the first semiconductor region. The second semiconductor region preferably has an impurity concentration which is higher than that in the channel region, and the first semiconductor region preferably has an impurity concentration which is lower than that in the source region and the drain region and is lower than that in the second semiconductor region.

According to this configuration of this exemplary embodiment of the present invention, the first semiconductor region having a low impurity concentration is provided between the second semiconductor region which is an extracting region of excessive carriers and the source and drain regions to suppress the gradient of the impurity concentrations between the second semiconductor region and the source and drain regions. Thus, the breakdown voltage of the junctions between the second semiconductor region and the source and drain regions may be maintained at a high level.

In another exemplary embodiment of the present invention, in the semiconductor device, the first semiconductor region may be a semiconductor of the second conductive type and may have an impurity concentration which is lower than that in the source region and the drain region.

According to this configuration of this exemplary embodiment of the present invention, the first semiconductor region of the second conductive type having a low impurity concentration is provided between the second semiconductor region as an extracting region of the excessive carriers and the source and drain regions. Thus, the breakdown voltage of the junctions between the second semiconductor region and the source and drain regions may be maintained at a high level.

In another exemplary embodiment of the present invention, in the semiconductor device, the first semiconductor region may be a semiconductor of the first conductive type, and may have an impurity concentration which is lower than that in the second semiconductor region.

According to this configuration of this exemplary embodiment of the present invention, the first semiconductor region of the first conductive type having a low impurity concentration is provided between the second semiconductor region as an extracting region of the excessive carriers and the source and drain regions. Thus, the breakdown voltage of the junctions between the second semiconductor region and the source and drain regions may be maintained at a high level.

In another exemplary embodiment of the present invention, in the semiconductor device, the first semiconductor region may be a semiconductor of the first conductive type, and may have an impurity concentration which is substantially the same as that in the channel region.

According to this configuration of this exemplary embodiment of the present invention, the first semiconductor region may be formed by the same step for implanting an impurity into the channel region without an additional step.

In another exemplary embodiment of the present invention, in the semiconductor device, the first semiconductor region may substantially not be doped with an impurity.

According to this configuration of this exemplary embodiment of the present invention, the first semiconductor region, which is substantially not doped with an impurity, may be provided between the second semiconductor region which is an extracting region of excessive carriers and the source and drain regions to at least suppress the gradient of the impurity concentrations between the second semiconductor region and the source and drain regions. Thus, the breakdown voltage of the junctions between the second semiconductor region and the source and drain regions may be maintained at a high level.

In another exemplary embodiment of the present invention, in the semiconductor device, an LDD region of the second conductive type may be formed between the channel region and the source region and between the channel region and drain region, and the first semiconductor region may be a semiconductor of the second conductive type and may have an impurity concentration which is substantially the same as that in the LDD region.

According to this configuration of this exemplary embodiment of the present invention, the first semiconductor region may be formed by the same step for implanting an impurity into the LDD region without an additional step.

In another exemplary embodiment of the present invention, in the semiconductor device, an LDD region of the second conductive type may be formed between the channel region and the source region and between the channel region and drain region, and the first semiconductor region may be a semiconductor of the first conductive type and may have an impurity concentration which is substantially the same as that in an LDD region formed in a MOS transistor complementing a MOS transistor of the conductive type which is the same as that of the channel region.

According to this configuration of this exemplary embodiment of the present invention, the first semiconductor region may be formed by the same step for implanting an impurity into the LDD region without an additional step.

In another exemplary embodiment of the present invention, in the semiconductor device, the supporting substrate having insulation at least at a surface thereof preferably consists of a base substrate and an insulating layer formed on the base substrate.

Also, in another exemplary embodiment of the present invention, in the semiconductor device, the base substrate preferably consists of single-crystal silicon.

According to these configurations of the above exemplary embodiments of the present invention, the semiconductor device may be used as a device substrate for an electro-optical device, such as a reflective liquid crystal device. Moreover, a bulk silicon device may be used without modification.

In another exemplary embodiment of the present invention, in the semiconductor device, the base substrate preferably consists of quartz, and the semiconductor layer formed on the insulating layer of the supporting substrate preferably consists of single-crystal silicon.

Since the base substrate is transparent in this configuration of this exemplary embodiment of the present invention, the semiconductor device may be used as a device substrate for a transmissive electro-optical device, such as a liquid crystal device. This base substrate allows a high-temperature processing which is not applicable to glass, and thus a high-quality insulating film and the like may be provided and the device is highly reliable. Since the semiconductor layer is composed of single-crystal silicon, a high-quality, high-definition electro-optical device with a high drive frequency may be obtained.

In another exemplary embodiment of the present invention, in the semiconductor device, the base substrate preferably consists of quartz, and the semiconductor layer formed on the insulating layer of the supporting substrate preferably consists of polycrystalline silicon.

Since the base substrate is transparent in this configuration of this exemplary embodiment of the present invention, the semiconductor device may be used as a device substrate for a transmissive electro-optical device, such as a liquid crystal device. This base substrate allows a high-temperature processing which is not applicable to glass, and thus a high-quality insulating film and the like may be provided and the device is highly reliable. Since the semiconductor layer may be composed of polycrystalline silicon, the layer may be readily formed on the base substrate and a high-quality, high-definition electro-optical device with a high drive frequency may be obtained.

In another exemplary embodiment of the present invention, in the semiconductor device, the base substrate preferably consists of glass.

Since the base substrate is an inexpensive transparent supporting substrate in this configuration of this exemplary embodiment of the present invention, a device substrate for a transmissive electro-optical device, such as a liquid crystal device, may be provided at reduced cost.

In another exemplary embodiment of the present invention, a semiconductor gate array preferably consists of a supporting substrate having insulation at least at a surface thereof, a semiconductor layer formed on the surface of the supporting substrate, and a plurality of MOS transistors formed in the semiconductor layer. Each of the MOS transistors preferably consists of a channel region of a first conductive type formed on the surface of the supporting substrate, a source region and a drain region of a second conductive type formed on the surface of the supporting substrate so as to sandwich the channel region, an insulating layer formed on the channel region, and an electrode formed on the insulating layer. The semiconductor gate array may further consist of a first semiconductor region provided on the surface of the supporting substrate at least at one end in the channel width direction of at least one of the source region and the drain region along the channel length direction, and a second semiconductor region of the first conductive type provided on the surface of the supporting substrate so as to sandwich the first semiconductor region by the source region or the drain region along the first semiconductor region. The second semiconductor region preferably has an impurity concentration which is higher than that in the channel region, and the first semiconductor region preferably has an impurity concentration which is lower than that in the source region and the drain region and is lower than that in the second semiconductor region.

According to this configuration of this exemplary embodiment of the present invention, also in the semiconductor gate array including the plurality of MOS transistors, the first semiconductor region having a low impurity concentration is provided between the second semiconductor region which is an extracting region of excessive carriers and the source and drain regions. Thus, the breakdown voltage of the junctions between the second semiconductor region and the source and drain regions may be maintained at a high level.

In another exemplary embodiment of the present invention, in the semiconductor gate array, the first semiconductor region of each MOS transistor may be a semiconductor of the second conductive type, and may have an impurity concentration which is lower than that in the source region, and the drain region.

According to this configuration of this exemplary embodiment of the present invention, also in the semiconductor gate array including the plurality of MOS transistors, the first semiconductor region of the second conductive type having a low impurity concentration is provided between the second semiconductor region as an extracting region of the excessive carriers and the source and drain regions. Thus, the breakdown voltage of the junctions between the second semiconductor region and the source and drain regions may be maintained at a high level.

In another exemplary embodiment of the present invention, in the semiconductor gate array, the first semiconductor region of each MOS transistor may be a semiconductor of the first conductive type, and may have an impurity concentration which is lower than that in the second semiconductor region.

According to this configuration of this exemplary embodiment of the present invention, also in the semiconductor gate array including the plurality of MOS transistors, the first semiconductor region of the first conductive type having a low impurity concentration is provided between the second semiconductor region as an extracting region of the excessive carriers and the source and drain regions. Thus, the breakdown voltage of the junctions between the second semiconductor region and the source and drain regions may be maintained at a high level.

In another exemplary embodiment of the present invention, in the semiconductor gate array, the first semiconductor region of each MOS transistor may be a semiconductor of the first conductive type, and may have an impurity concentration which is substantially the same as that in the channel region.

According to this configuration of this exemplary embodiment of the present invention, the first semiconductor region may be formed by the same step for implanting an impurity into the channel region without an additional step.

In another exemplary embodiment of the present invention, in the semiconductor gate array, the first semiconductor region of each MOS transistor may be substantially not be doped with an impurity.

According to this configuration of this exemplary embodiment of the present invention, also in the semiconductor gate array including the plurality of MOS transistors, the first semiconductor region, which is substantially not doped with an impurity, is provided between the second semiconductor region which is an extracting region of excessive carriers and the source and drain regions. Thus, the breakdown voltage of the junctions between the second semiconductor region and the source and drain regions may be maintained at a high level.

In another exemplary embodiment of the present invention, in the semiconductor gate array, an LDD region of the second conductive type may be formed between the channel region and the source region and between the channel region and drain region, and the first semiconductor region of each MOS transistor may be a semiconductor of the second conductive type and may have an impurity concentration which is substantially the same as that in the LDD region.

According to this configuration of this exemplary embodiment of the present invention, the first semiconductor region may be formed by the same step for implanting an impurity into the LDD region without an additional step.

In another exemplary embodiment of the present invention, in the semiconductor gate array, an LDD region of the second conductive type may be formed between the channel region and the source region and between the channel region and drain region, and the first semiconductor region of each MOS transistor may be a semiconductor of the first conductive type and may have an impurity concentration which is substantially the same as that in an LDD region formed in a MOS transistor complementing a MOS transistor of the conductive type which is the same as that of the channel region.

According to this configuration of this exemplary embodiment of the present invention, the first semiconductor region may be formed by the same step for implanting an impurity into the LDD region without an additional step.

In another exemplary embodiment of the present invention, in the semiconductor gate array, the supporting substrate having insulation at least at a surface thereof preferably consists of a base substrate and an insulating layer formed on the base substrate.

In another exemplary embodiment of the present invention, in the semiconductor device, the base substrate preferably consists of a single-crystal silicon.

According to these configurations of the above exemplary embodiments of the present invention, the semiconductor gate array may be used as a device substrate for an electro-optical device, such as a reflective liquid crystal device. Moreover, a bulk silicon device may be used without modification.

In another exemplary embodiment of the present invention, in the semiconductor gate array, the base substrate preferably consists of quartz, and the semiconductor layer formed on the insulating layer preferably consists of single-crystal silicon.

Since the base substrate is transparent in this configuration of this exemplary embodiment of the present invention, the semiconductor gate array may be used as a device substrate for a transmissive electro-optical device, such as a liquid crystal device. This base substrate allows a high-temperature processing which may be not applicable to glass, and thus a high-quality insulating film and the like may be provided and the device is highly reliable. Since the semiconductor layer is composed of single-crystal silicon, a high-quality, high-definition electro-optical device with a high drive frequency may be obtained.

In another exemplary embodiment of the present invention, in the semiconductor gate array, the base substrate preferably consists of quartz, and the semiconductor layer formed on the insulating layer comprises polycrystalline silicon.

Since the base substrate is transparent in this configuration of this exemplary embodiment of the present invention, the semiconductor gate array may be used as a device substrate for a transmissive electro-optical device, such as a liquid crystal device. This base substrate allows a high-temperature processing which may be not applicable to glass, and thus a high-quality insulating film and the like may be provided and the device is highly reliable. Since the semiconductor layer is composed of polycrystalline silicon, the layer may be readily formed on the base substrate and a high-quality, high-definition electro-optical device with a high drive frequency may be obtained.

In another exemplary embodiment of the present invention, in the semiconductor gate array, the base substrate preferably consists of glass.

Since the base substrate is an inexpensive transparent supporting substrate in this configuration of this exemplary embodiment of the present invention, a device substrate for a transmissive electro-optical device, such as a liquid crystal device, may be provided at reduced cost.

In another exemplary embodiment of the present invention, the semiconductor device preferably consists of a supporting substrate having insulation at least at a surface thereof, a semiconductor layer formed on the surface of the supporting substrate, and a plurality of MOS transistors formed in the semiconductor layer and connected to each other in series. Each of the MOS transistors preferably consists of a channel region of a first conductive type formed on the surface of the supporting substrate, a source region and a drain region of a second conductive type formed on the surface of the supporting substrate so as to sandwich the channel region, an insulating layer formed on the channel region, and an electrode formed on the second insulating layer. The semiconductor device may further consist of a first semiconductor region provided on the surface of the supporting substrate at least at one end in the channel width direction of one of the source region and the drain region along the channel length direction, which is not directly connected to an electrical power source, and a second semiconductor region of the first conductive type provided on the surface of the supporting substrate so as to sandwich the first semiconductor region by the source region or the drain region along the first semiconductor region. The semiconductor device may further consist of a third semiconductor region of the first conductive type provided on the surface of the supporting substrate at least at one end in the channel width direction of one of the source region and the drain region along the source region and the drain region, which may be directly connected to the electrical power source. Each of the second semiconductor region and the third semiconductor region has an impurity concentration which is higher than that in the channel region, and the first semiconductor region has an impurity concentration which is lower than that in the source region and the drain region and is lower than that in the second semiconductor region.

According to this exemplary configuration of this exemplary embodiment, also in the semiconductor device provided with the plurality of MOS transistors, which are connected in series, as used in a logic circuit, the first semiconductor region having a low impurity concentration is provided between the second semiconductor region as an extracting region of the excessive carriers and the source and drain regions so as to suppress the gradient of the impurity concentrations between the second semiconductor region and the source region. Thus, the breakdown voltage of the junction between the second semiconductor region and the source region may be maintained at a high level. In addition, the first semiconductor region is provided only in the source region of each MOS transistor which may be not directly connected to the electrical power source, and thus the semiconductor device exhibits low resistance.

In another exemplary embodiment of the present invention, in the semiconductor device, the first semiconductor region may be a semiconductor of the second conductive type, and may have an impurity concentration which may be lower than that in the source region and the drain region.

According to this configuration of this exemplary embodiment of the present invention, the semiconductor device having the plurality of MOS transistors connected in series includes the first semiconductor region of the second conductive type having a low impurity concentration which is provided between the second semiconductor region as an extracting region of the excessive carriers and the source and drain regions. Thus, the breakdown voltage of the junction between the second semiconductor region and the source region may be maintained at a high level.

In another exemplary embodiment of the present invention, in the semiconductor device, the first semiconductor region may be a semiconductor of the first conductive type, and may have an impurity concentration which may be lower than that in the second semiconductor region.

According to this configuration of this exemplary embodiment of the present invention, the semiconductor device having the plurality of MOS transistors connected in series includes the first semiconductor region of the first conductive type having a low impurity concentration which is provided between the second semiconductor region as an extracting region of the excessive carriers and the source and drain regions. Thus, the breakdown voltage of the junction between the second semiconductor region and the source region may be maintained at a high level.

In another exemplary embodiment of the present invention, in the semiconductor device, the first semiconductor region may be a semiconductor of the first conductive type, and may have an impurity concentration which may be substantially the same as that in the channel region.

According to this configuration of this exemplary embodiment of the present invention, the first semiconductor region may be formed by the same step for implanting an impurity into the channel region without an additional step.

In another exemplary embodiment of the present invention, in the semiconductor device, the first semiconductor region may be substantially not be doped with an impurity.

According to this configuration of this exemplary embodiment of the present invention, the semiconductor device having the plurality of MOS transistors connected in series includes the first semiconductor region substantially not doped with an impurity which is provided between the second semiconductor region as an extracting region of the excessive carriers and the source and drain regions. Thus, the breakdown voltage of the junction between the second semiconductor region and the source region may be maintained at a high level.

In another exemplary embodiment of the present invention, in the semiconductor device, an LDD region of the second conductive type may be formed between the channel region and the source region and between the channel region and drain region, and the first semiconductor region may be a semiconductor of the second conductive type and may have an impurity concentration which may be substantially the same as that in the LDD region.

According to this configuration of this exemplary embodiment of the present invention, the first semiconductor region may be formed by the same step for implanting an impurity into the LDD region without an additional step.

In another exemplary embodiment of the present invention, in the semiconductor device, an LDD region of the second conductive type may be formed between the channel region and the source region and between the channel region and drain region, and the first semiconductor region may be a semiconductor of the first conductive type and may have an impurity concentration which may be substantially the same as that in an LDD region formed in a MOS transistor complementing a MOS transistor of the conductive type which may be the same as that of the channel region.

According to this configuration of this exemplary embodiment of the present invention, the first semiconductor region may be formed by the same step for implanting an impurity into the LDD region without an additional step.

In another exemplary embodiment of the present invention, in the semiconductor device, the supporting substrate having insulation at least at a surface thereof preferably consists of a base substrate and an insulating layer formed on the base substrate.

In another exemplary embodiment of the present invention, in the semiconductor device, the base substrate preferably consists of single-crystal silicon.

According to these configurations of the above exemplary embodiments of the present invention, the semiconductor device may be used as a device substrate for an electro-optical device, such as a reflective liquid crystal device. Moreover, a bulk silicon device may be used without modification.

In another exemplary embodiment of the present invention, in the semiconductor device, the base substrate preferably consists of quartz, and the semiconductor layer formed on the insulating layer of the supporting substrate preferably consists of single-crystal silicon.

Since the base substrate is transparent in this configuration of this exemplary embodiment of the present invention, the semiconductor device may be used as a device substrate for a transmissive electro-optical device, such as a liquid crystal device. This base substrate allows a high-temperature processing which is not applicable to glass, and thus a high-quality insulating film and the like may be provided and the device is highly reliable. Since the semiconductor layer may be composed of single-crystal silicon, a high-quality, high-definition electro-optical device with a high drive frequency may be obtained.

In another exemplary embodiment of the present invention, in the semiconductor device, the base substrate preferably consists of quartz, and the semiconductor layer formed on the insulating layer of the supporting substrate preferably consists of polycrystalline silicon.

Since the base substrate is transparent in this configuration of this exemplary embodiment of the present invention, the semiconductor device may be used as a device substrate for a transmissive electro-optical device, such as a liquid crystal device. This base substrate allows a high-temperature processing which is not applicable to glass, and thus a high-quality insulating film and the like may be provided and the device is highly reliable. Since the semiconductor layer may be composed of polycrystalline silicon, the layer may be readily formed on the base substrate and a high-quality, high-definition electro-optical device with a high drive frequency may be obtained.

In another exemplary embodiment of the present invention, in the semiconductor device, the base substrate preferably consists of glass.

Since the base substrate is an inexpensive transparent supporting substrate in this configuration of the present invention, a device substrate for a transmissive electro-optical device, such as a liquid crystal device, may be provided at reduced cost.

In another exemplary embodiment of the present invention, an electro-optical device may consist of a supporting substrate constituting any one of the above semiconductor device, the above semiconductor gate array, and the above semiconductor device, another supporting substrate facing a semiconductor layer formed on a insulating layer on the supporting substrate, and a liquid crystal disposed between these two supporting substrates and driven by transistor elements in the semiconductor layer.

In another exemplary embodiment of the present invention, in the electronic equipment may consist of a light source, the above electro-optical device for modulating light incident on the light source in response to image information, and a projection device for projecting the light modulated by the electro-optical device.

DETAILED DESCRIPTION OF PREFERRED EMBODIMENTS

In accordance with the present invention, the semiconductor device formed on the semiconductor layer on the insulating layer, the semiconductor gate array having the plurality of semiconductor devices arranged on the semiconductor layer on the insulating layer, and the semiconductor device having the plurality of MOS transistors which are connected in series formed on the semiconductor layer on the insulating layer will be described with reference to the following various exemplary embodiments.

An NMOS transistor and a channel region of a P type (first conductive type) are described as examples in the following exemplary embodiments.
First Exemplary Embodiment A first exemplary embodiment of the present invention relates to a semiconductor device including a MOS transistor formed on a semiconductor layer on an insulating layer and is a basic form for other exemplary embodiments which follow.

Figure 1:
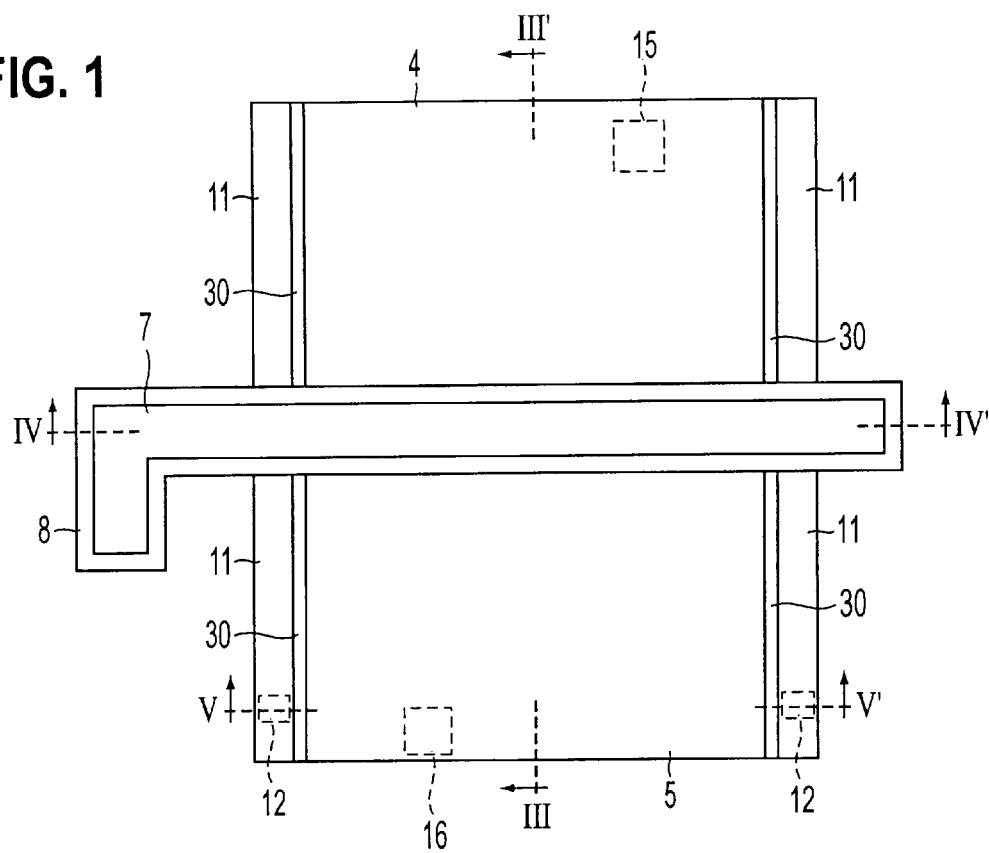
FIG. 1 is a plan view of a semiconductor device formed on a semiconductor layer on an insulating layer of an exemplary embodiment of the present invention in which a contact line layer and an interlayer insulating film in source and drain regions are omitted.
Figure 2:
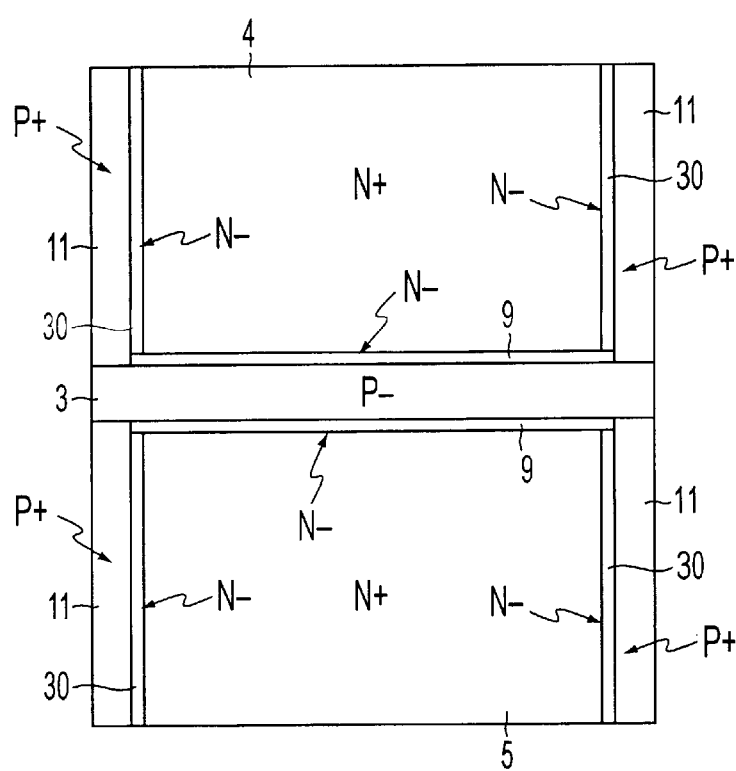
FIG. 2 shows an exemplary configuration on a face including source/drain regions in the semiconductor device of the present invention.
Figure 3:
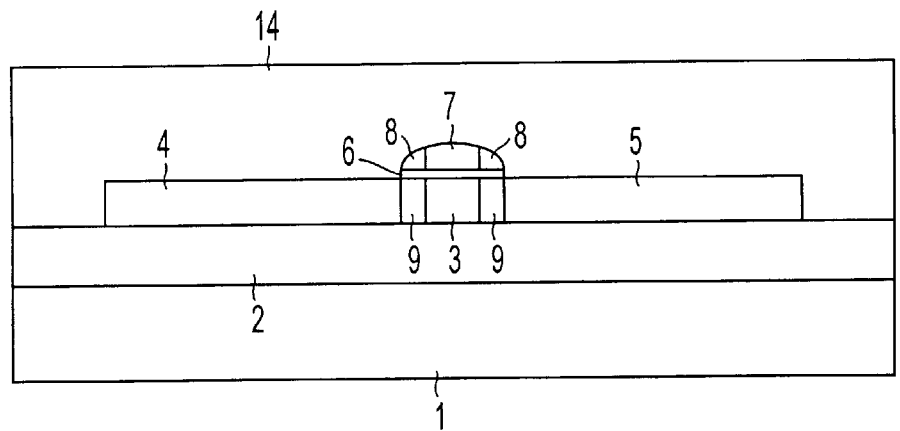
FIG. 3 is a cross-sectional view taken along line III–III' in FIG. 1.
Figure 4:
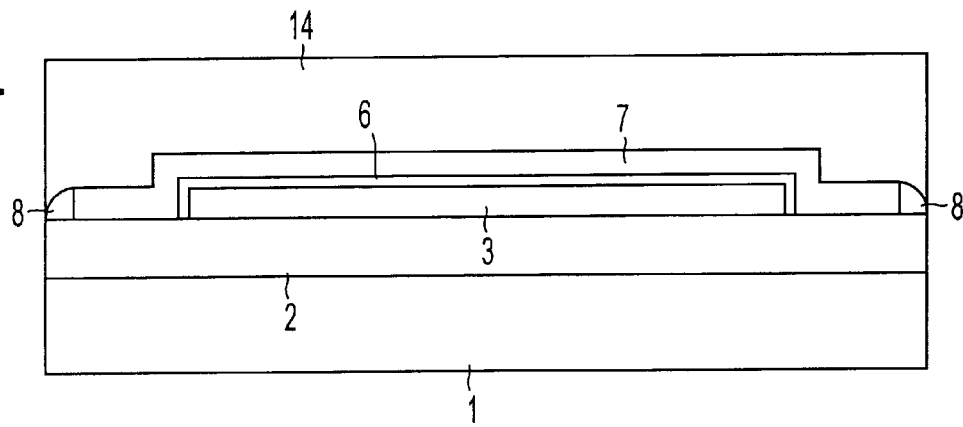
FIG. 4 is a cross-sectional view taken along line IV–IV' in FIG. 1.
Figure 5:
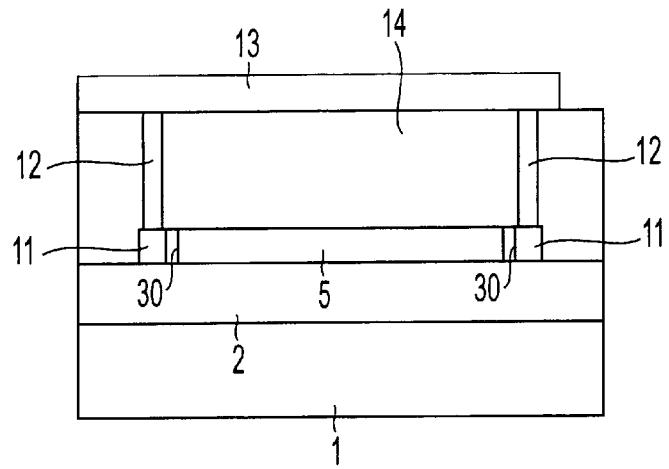
FIG. 5 is a cross-sectional view taken along line V–V! in FIG. 1.

The semiconductor device formed on the semiconductor layer on the insulating layer of the first exemplary embodiment of the present invention has a structure shown in FIGS. 1 to 5. FIG. 1 is a plan view showing the first embodiment. The transverse direction in FIG. 1 is called the "channel width direction" and the direction perpendicular to the channel width direction is called the "channel length direction". FIG. 2 shows a configuration on a face including source/drain regions in the semiconductor device formed on the semiconductor layer on the insulating layer of the first embodiment of the present invention. FIGS. 3, 4, and 5 are cross-sectional views taken along line III–III', line IV–IV', and line V–V', respectively, in FIG. 1. Scales, such as planar sizes and film thicknesses of each layer and each component are varied so that each layer and each component is visible in the drawings.

With reference to FIGS. 1 to 5, in the first embodiment, a first insulating layer 2 composed of, for example, nonsilicate glass (NSG) having a thickness of 600 to 1,000 nm, and preferably of 800 nm, is formed on a base substrate 1 composed of, for example, quartz. A $P^-$-type channel region 3 doped with, for example, boron as an impurity and $N^+$-type (second conductive type) source/drain regions 4 and 5 doped with, for example phosphorus as an impurity are formed on the first insulating layer 2 in a predetermined region of a semiconductor layer composed of, for example, single-crystal silicon having a thickness of 150 to 200 nm, and preferably of approximately 170 nm, and these constitute a MOS transistor together with a second insulating layer (gate insulating film) 6 and a gate electrode 7 formed on the channel region 3. As shown in FIG. 3, side-wall insulating layers 8 are formed on side walls of the gate electrode 7 and the MOS transistor is completely covered with an interlayer insulating film 14.

As shown in FIG. 2, N-type semiconductor layers doped with, for example, phosphorus as an impurity are formed as lightly doped drain (LDD) regions 9 between the channel region 3 and the source/drain regions 4 and 5 in which the concentration of the impurity in the N-type semiconductor layers is lower than that in the source/drain regions 4 and 5, as in typical MOS transistors.

Moreover, first semiconductor regions 30 doped with, for example, phosphorus as an impurity are provided along the channel length direction at the ends in the channel width direction of the source/drain regions 4 and 5 on the first insulating layer 2, and $P^+$-type extracting regions 11 (second semiconductor regions) doped with, for example, boron as an impurity are provided on the first insulating layer 2 so that the first semiconductor regions 30 are sandwiched by the extracting regions 11 and the source/drain regions 4 and 5.

The extracting regions 11 have an impurity concentration which is higher than that in the channel region 3, and the first semiconductor regions 30 are of an $N^-$-type and have an impurity concentration which is substantially the same impurity concentration as that in the LDD regions 9. In this exemplary embodiment, conditions for implanting impurities in the formation of these semiconductor regions include, for example, $B^+$ ion species, an implantation energy of 25 to 45 keV and preferably of 35 keV, and a dose of $5\times10^{11}$ to $7\times10^{11}/cm^2$ and preferably of $6\times10^{11}/cm^2$ for the channel region 3; $P^+$ ion species, an implantation energy of 60 to 80 keV and preferably of 70 keV, and a dose of $3\times10^{15}$ to $5\times10^{15}/cm^2$ and preferably of $4\times10^{15}/cm^2$ for the source/drain regions 4 and 5; $BF_2^+$ ion species, an implantation energy of 80 to 100 keV and preferably of 90 keV, and a dose of $1\times10^{15}$ to $3\times10^{15}/cm^2$ and preferably of $2\times10^{15}/cm^2$ for the extracting regions 11; and $P^+$ ion species, an implantation energy of 60 to 80 keV and preferably of 70 keV, and a dose of $5\times10^{12}$ to $7\times10^{12}/cm^2$ and preferably of $6\times10^{12}/cm^2$ for the LDD regions 9 and the first semiconductor regions 30. Regarding planar sizes, the channel length is 4 to 6 µm and is preferably 5 µm; the channel width is 15 to 25 µm and is preferably 20 µm; the width of the LDD regions 9 (the size in the channel length direction) is 0.2 to 0.3 µm and is preferably 0.25 µm; the width of the extracting regions 11 (size in the channel width direction) is 0.9 to 1.1 µm and is preferably 1 µm; and the width of the first semiconductor regions 30 (size in the channel width direction) is 1.4 to 1.6 µm and is preferably 1.5 µm.

As shown in FIG. 5, the extracting regions 11 are connected to a wiring layer 13 provided on the interlayer insulating film 14 via contact lines 12. Numerals 15 and 16 in FIG. 1 represent contact lines which are electrically connected to the source/drain regions 4 and 5.

In the semiconductor device of the first exemplary embodiment, excessive carriers generated in the channel region 3 by impact ionization are extracted to the exterior via the contact lines 12 and the wiring layer 13.

Accordingly, a supporting substrate stray effect due to electrical stray of the channel region may be prevented. Moreover, the first semiconductor regions 30 having the low impurity concentration are provided between the extracting regions 11 and the source/drain regions 4 and 5. Thus, breakage of the junctions between the extracting regions 11 and the source/drain regions 4 and 5 may be prevented at a drive voltage of approximately 15 volts, which is used in electro-optical devices such as liquid crystal displays. For example, when the impurity concentrations of individual regions of this exemplary embodiment are employed, the breakdown voltage at the junction may be maintained at 15 volts or more.

In the first exemplary embodiment of the present invention, the first semiconductor regions 30 are of an $N^-$-type and have an impurity concentration which is the same as that in the LDD regions 9. Thus, the first semiconductor regions 30 may be formed by the step for implanting an impurity into the LDD regions without providing an additional step for introducing another impurity into the first semiconductor regions 30.

Figure 6:
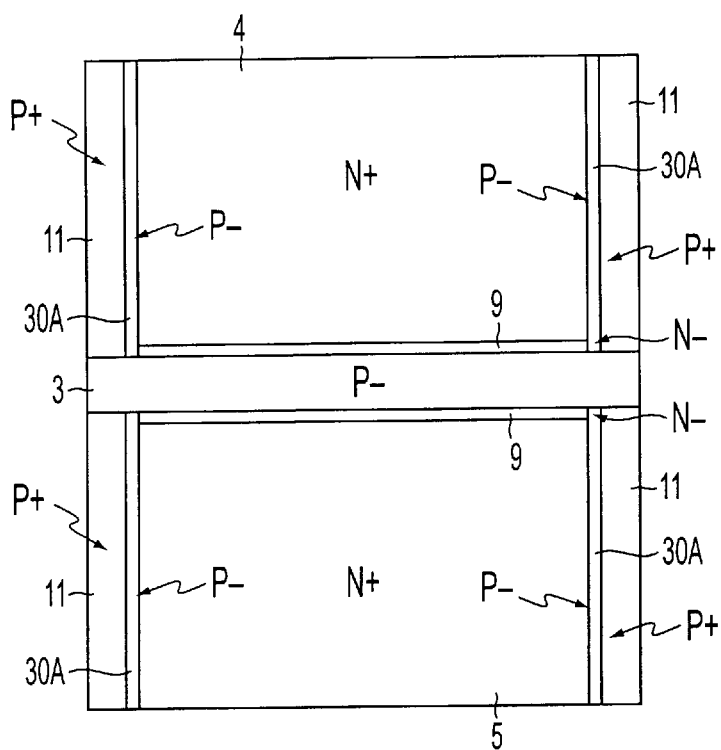
FIG. 6 shows another exemplary configuration on a face including source/drain regions in the semiconductor device of the present invention.

Alternatively, as shown in FIG. 6, $P^-$-type first semiconductor regions 30A having a concentration which is substantially the same as that in the channel region 3 may be provided. In this configuration, the first semiconductor regions 30A may be formed by a step for implanting an impurity into the channel region 3 with no additional step.

Figure 7:
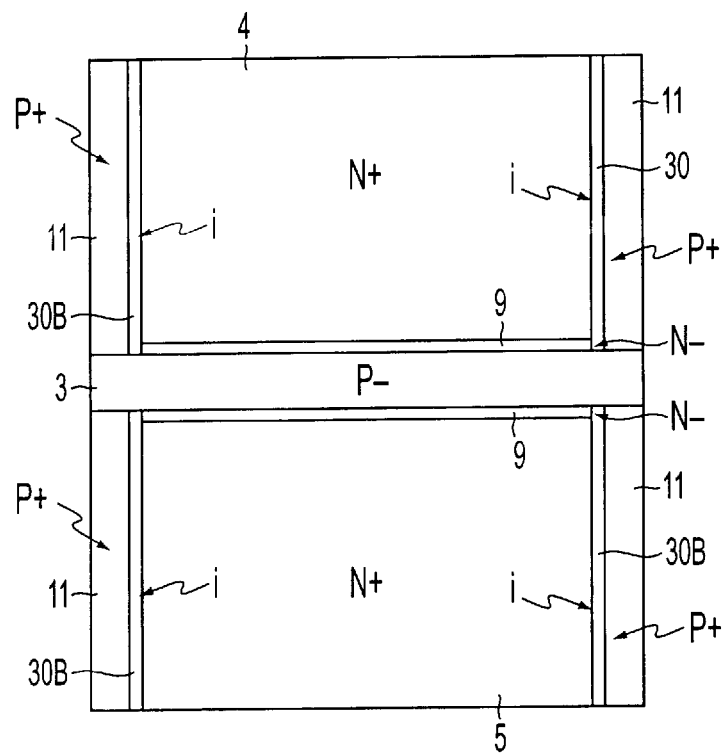
FIG. 7 shows another exemplary configuration on a face including source/drain regions in the semiconductor device of the present invention.

Alternatively, as shown in FIG. 7, first semiconductor regions 30B which are not substantially doped with an impurity may be provided.

Figure 8:
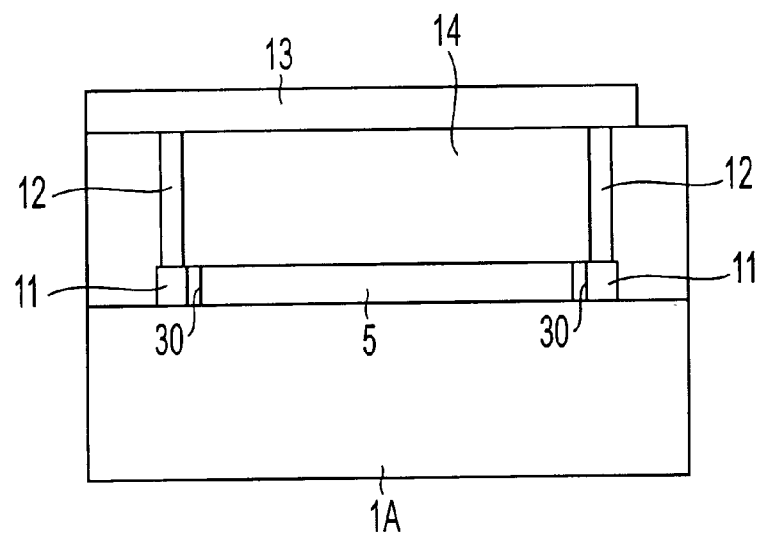
FIG. 8 is a cross-sectional view of another exemplary configuration of the semiconductor device taken along line V–V' in FIG. 1.
Figure 9:
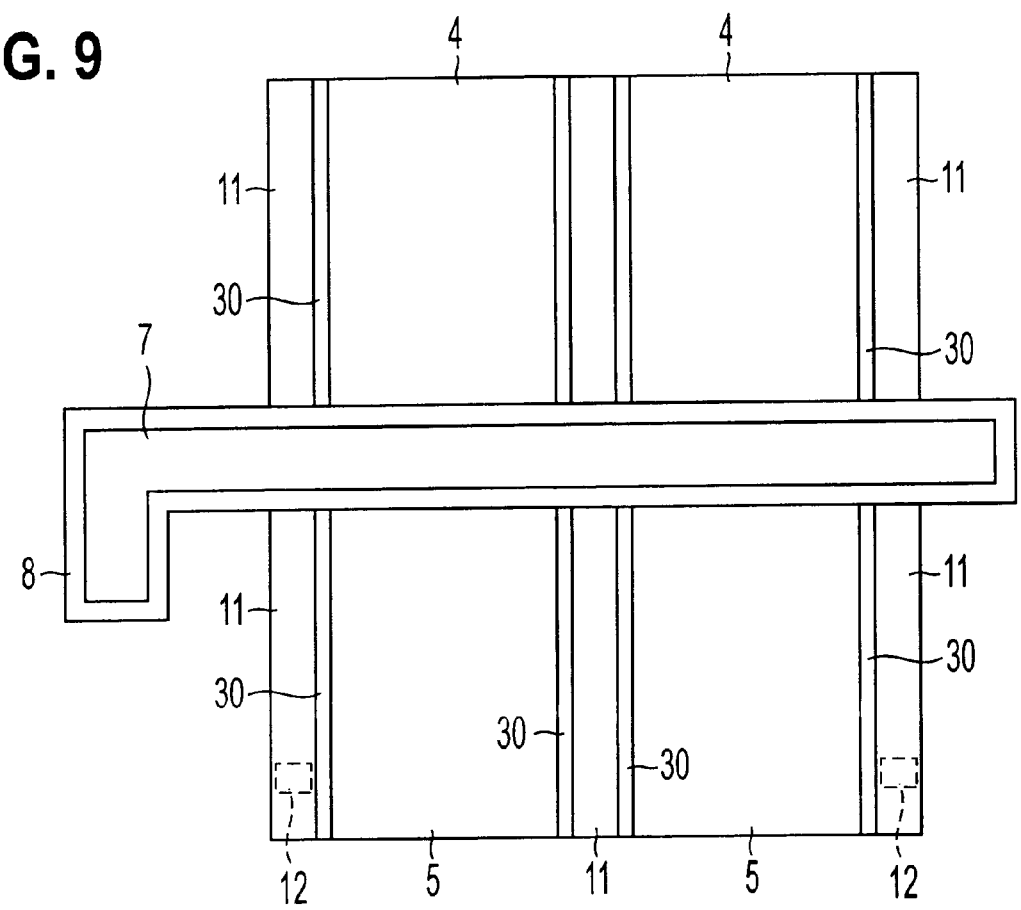
FIG. 9 is a plan view of another exemplary embodiment of the semiconductor device in which the contact line layer and the interlayer insulating film in source and drain regions are omitted.

Although this exemplary embodiment shows a semiconductor layer constituting a MOS transistor on the first insulating layer 2 on the base substrate 1, the present invention is applicable to all semiconductor devices provided with a supporting substrate having insulation at least at the surface thereof. As shown in FIG. 8 which corresponds to a cross-sectional view taken along line V–V' in FIG. 1, the present invention is also applicable to a semiconductor device in which a semiconductor layer having a source/drain region 5 is directly formed on a base substrate 1A composed of, for example, quartz or glass.

When the channel width is large, the efficiency of extraction of excessive carriers from the channel region 3 may be insufficient via the extracting regions 11 at both ends in the channel width direction. In this case, the extracting region 11 may also be provided in the central portion, in addition to both ends in the channel width direction. In this case, the first semiconductor regions 30 may be formed along the channel length direction at both sides of the central extracting region 11. The breakage of the junctions between the extracting regions 11 and the source/drain regions 4 and 5 can thereby be prevented.

Although the device isolation is achieved by mesa isolation in the first exemplary embodiment of the present invention, any known device isolation method, e.g., LOCOS (local-oxidation-of-silicon) isolation and trench isolation, may be employed.

The first exemplary embodiment of the present invention is not limited to the NMOS and may also be applicable to PMOS. Furthermore, the present invention may be applicable to a configuration not provided with a LDD region.

The conditions for implanting impurities to form semiconductor regions shown in the first exemplary embodiment of the present invention are described for illustration purposes and are not for limitations.

Second Exemplary Embodiment

A second exemplary embodiment includes an array of semiconductor devices as an application of the first exemplary embodiment.

Figure 10:
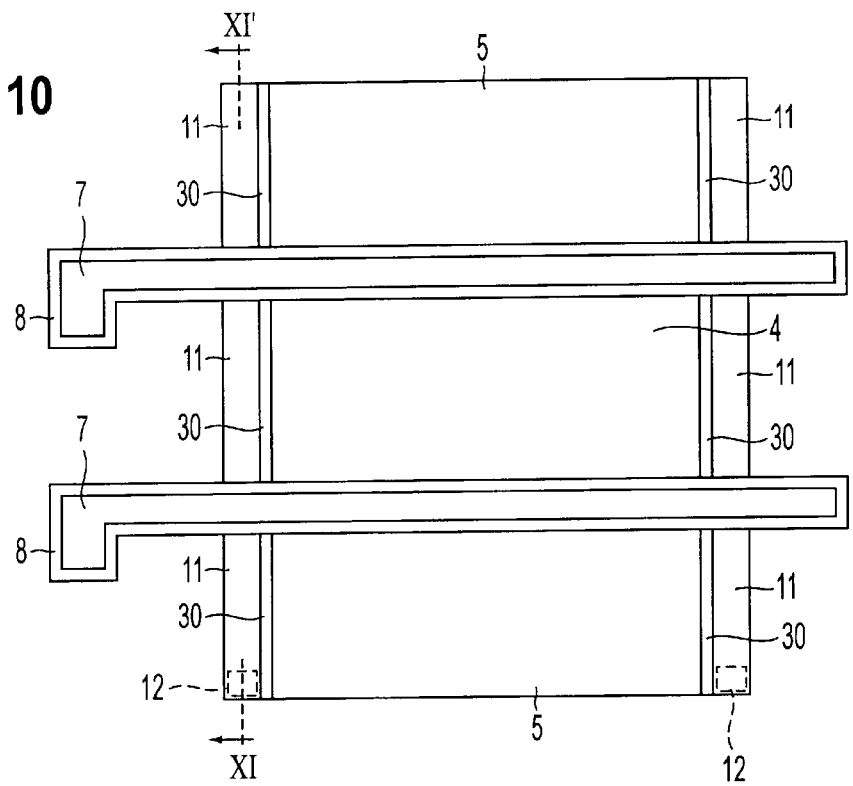
FIG. 10 is a plan view of a semiconductor gate array formed on a semiconductor layer on an insulating layer of another exemplary embodiment of the present invention in which an interlayer insulating film is omitted.
Figure 11:
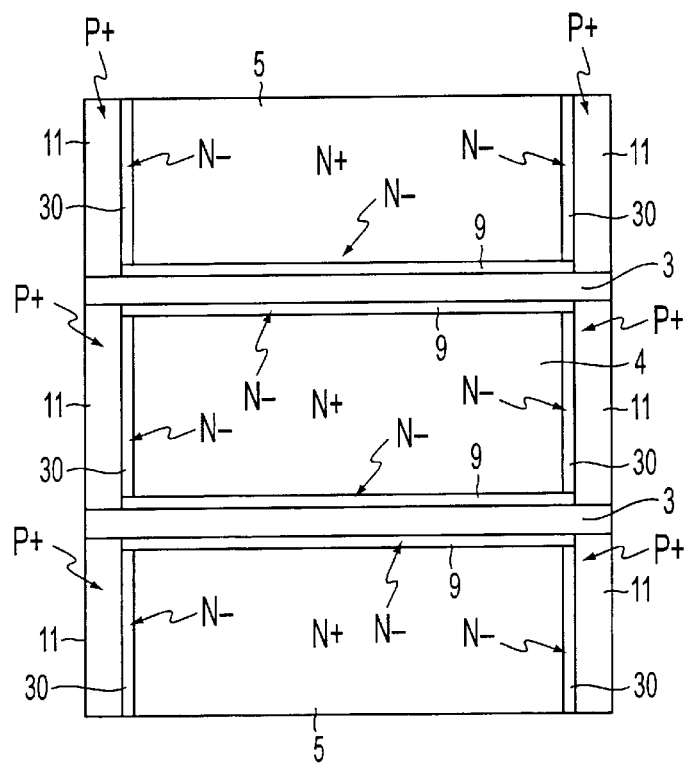
FIG. 11 shows an exemplary configuration on a face including source/drain regions in the semiconductor gate array.
Figure 12:
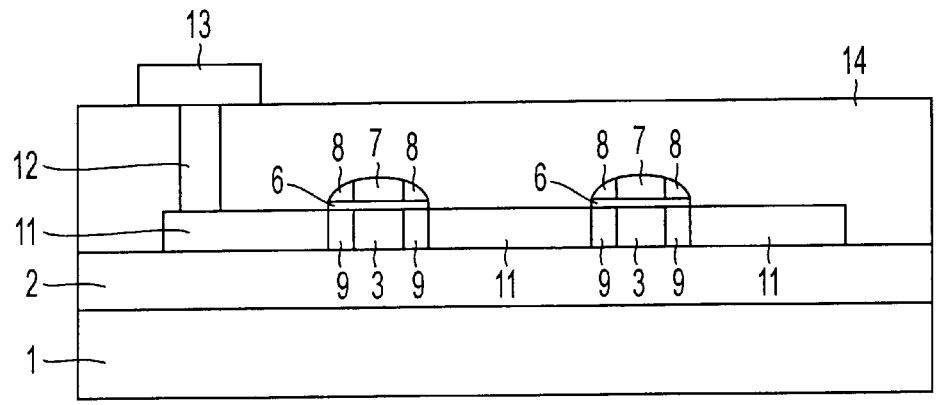
FIG. 12 is a cross-sectional view taken along line XI–XI' in FIG. 10.

FIG. 10 is a plan view of a semiconductor gate array of the second exemplary embodiment of the present invention in which semiconductor devices of the first exemplary embodiment are arranged in an array. The transverse direction in FIG. 10 is referred to as the "channel width direction" whereas the direction perpendicular to the channel width direction is referred to as the "channel length direction". In FIG. 10, contact lines from the source/drain regions 4 and 5 are not shown. FIG. 11 shows a configuration on a face including the source/drain regions in the semiconductor device of this exemplary embodiment. FIG. 12 is a cross-sectional view taken along line XI–XI' in FIG. 10.

With reference to FIGS. 10 to 12, in the second exemplary embodiment, a first insulating layer 2 is formed on a base substrate 1. Two $P^-$-type channel regions 3 and three source/drain regions 4 and 5 delimited by the two channel regions 3 are provided in a predetermined region on the semiconductor layer. Moreover, second insulating layers (gate insulating films) 6 are provided on the channel regions 3 and two MOS transistors having gate electrodes 7 are arranged in an array. As shown in FIG. 12, side-wall insulating layers 8 are formed on the side walls of each gate electrode 7 and the MOS transistors are completely covered with an interlayer insulating film 14.

As shown in FIG. 11, $N^-$-type semiconductor layers having an impurity concentration which is lower than that in the source/drain regions 4 and 5 are formed as LDD regions 9 between the channel regions 3 and the source/drain regions 4 and 5.

In addition, first semiconductor regions 30 are provided at the ends in the channel width direction of the source/drain regions 4 and 5 on the first insulating layer 2 along the channel length direction, and P+-type extracting regions (second semiconductor regions) 11 are provided on the first insulating layer 2 so that the first semiconductor regions 30 are sandwiched by the source/drain regions 4 and 5 and the extracting regions 11. The extracting regions 11 have an impurity concentration which is higher than that in the channel regions 3, and the first semiconductor regions 30 are of an $N^-$-type and have an impurity concentration which is substantially the same as that in the LDD regions 9.

As shown in FIG. 12, extracting regions 11 are connected to a wiring layer 13 provided on the interlayer insulating film 14 via contact lines 12.

Also in the semiconductor gate array of this exemplary embodiment provided with an array of MOS transistors, excessive carriers generated in the channel regions 3 are extracted to the exterior via the extracting regions 11, the contact lines 12, and the wiring layer 13.

Accordingly, a supporting substrate stray effect due to electrical stray of the channel regions may be prevented. Moreover, the first semiconductor regions 30 having the low impurity concentration are provided between the extracting regions 11 and the source/drain regions 4 and 5. Thus, breakage of the junctions between the extracting regions 11 and the source/drain regions 4 and 5 may be prevented at a drive voltage of approximately 15 volts, which is used in electro-optical devices such as liquid crystal displays.

Since the breakdown voltage at the junctions between the extracting regions 11 and the source/drain regions 4 and 5 is improved, a common body contact region may be provided for individual MOS transistors, even if the drive voltage is approximately 15 volts, and an effective layout may be employed.

Figure 13:
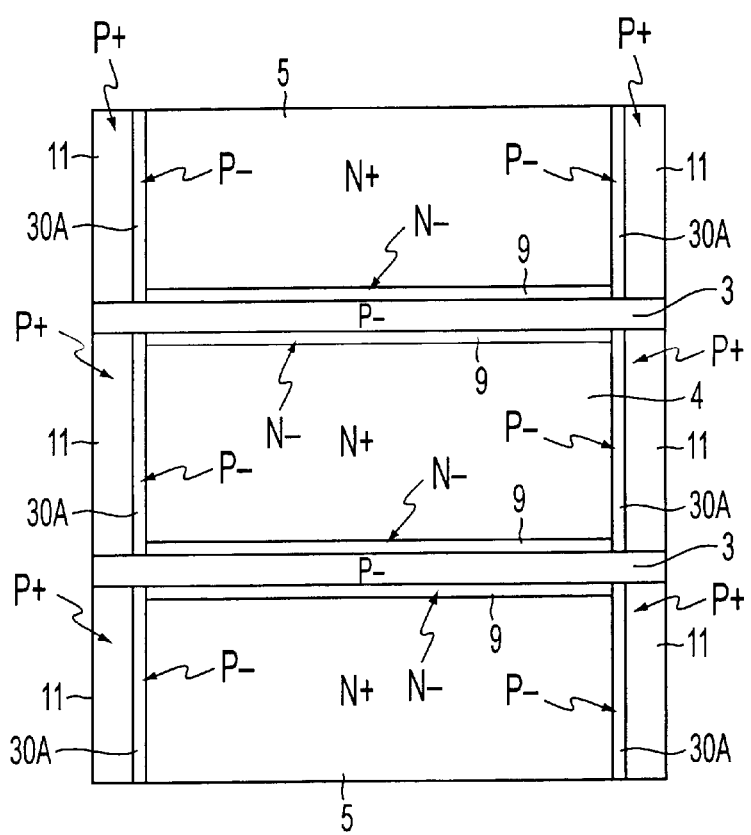
FIG. 13 shows another exemplary configuration on a face including source/drain regions in the semiconductor gate array.
Figure 14:
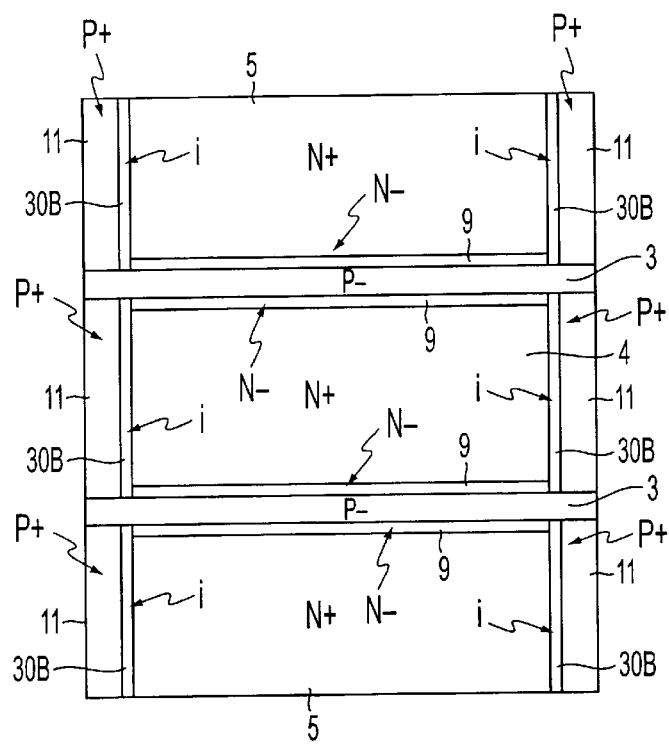
FIG. 14 shows an exemplary configuration on a face including source/drain regions in the semiconductor gate array.

Instead of the configuration in which the first semiconductor regions 30 are of the N$^-$-type and have an impurity concentration which is substantially the same as that in the LDD regions 9 in this exemplary embodiment, a configuration provided with first semiconductor regions 30A of a P$^-$-type having an impurity concentration which is substantially the same as that in the channel region 3, as shown in FIG. 13, and a configuration provided with first semiconductor regions 30B not substantially doped with an impurity, as shown in FIG. 14, are also applicable, as in the first exemplary embodiment. A configuration not provided with the first insulating layer 2 and a configuration not provided with the LDD regions 9 are also applicable to the second exemplary embodiment, as in the first exemplary embodiment.

Third Exemplary Embodiment

A third exemplary embodiment relates to a semiconductor device including a plurality of MOS transistors connected in series, which are used in logic circuits and the like, as an application of the first exemplary embodiment.

Figure 15:
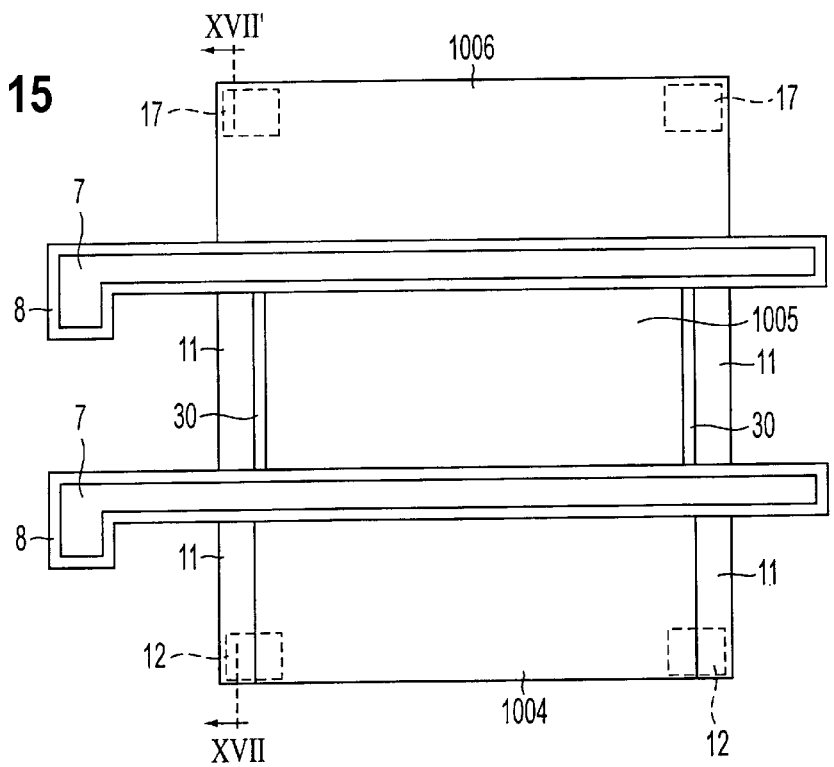
FIG. 15 is a plan view of a semiconductor device formed on a semiconductor layer on an insulating layer of an exemplary embodiment of the present invention in which an interlayer insulating film is omitted.
Figure 16:
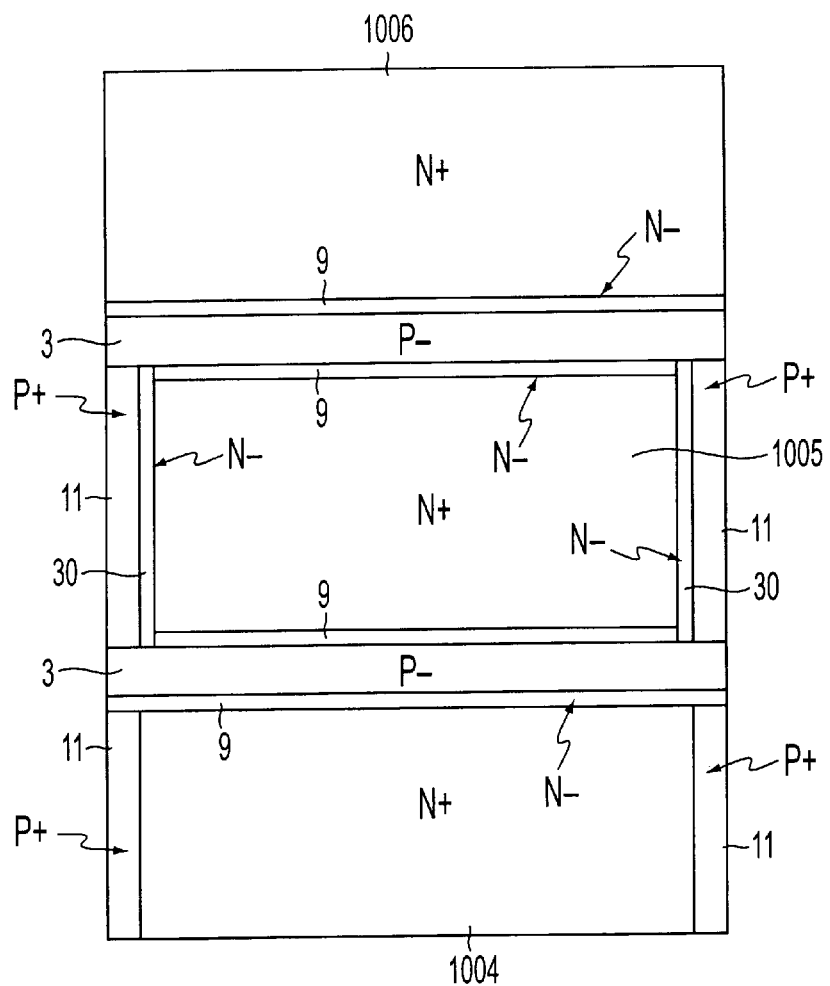
FIG. 16 shows another exemplary configuration on a face including source/drain regions in the semiconductor gate array.
Figure 17:
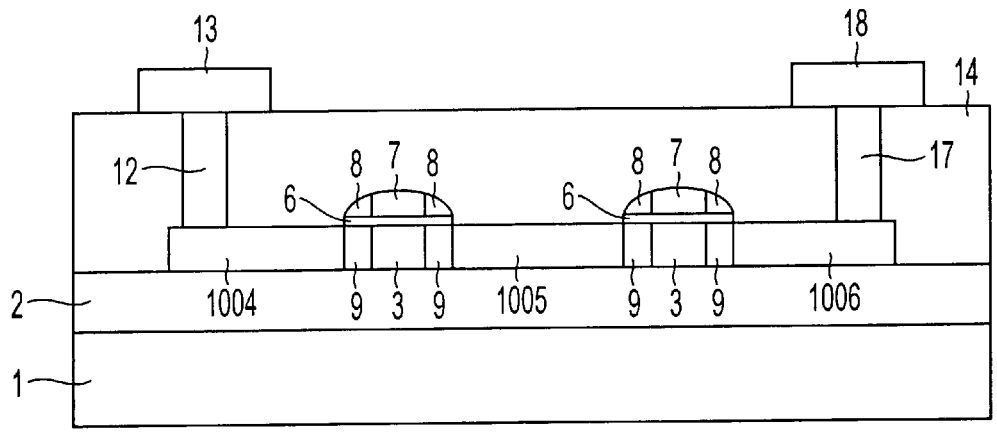
FIG. 17 is a cross-sectional view taken along line XVII–XVII' in FIG. 15.

FIG. 15 is a plan view of a semiconductor device which corresponds to a plurality of the MOS transistors of the first exemplary embodiment connected in series. The transverse direction in FIG. 15 is referred to as the "channel width direction" whereas the direction perpendicular to the channel width direction is referred to as the "channel length direction". FIG. 16 shows a configuration on a face including the source/drain regions in the semiconductor device of this exemplary embodiment. FIG. 17 is a cross-sectional view taken along line XVII–XVII' in FIG. 15.

Figure 18:
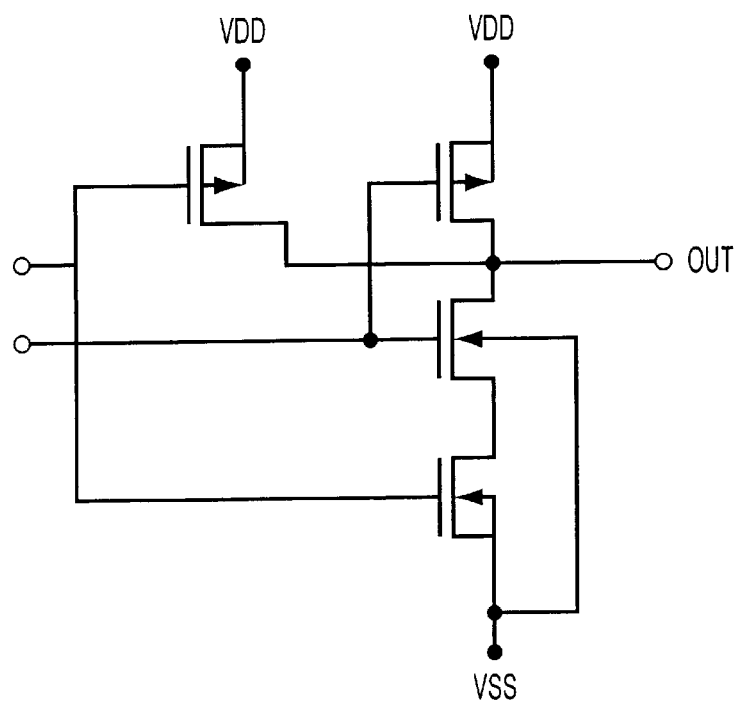
FIG. 18 is a NAND circuit diagram.

As shown in FIG. 18, a logic circuit such as a NAND (negative and) circuit has a portion in which MOS transistors are connected in series. FIG. 15 shows a portion in which two MOS transistors are connected in series.

With reference to FIGS. 15 to 17, a first insulating layer 2 is formed on a base substrate 1 in the third exemplary embodiment. Two P$^-$-type channel regions 3 and three impurity-doped regions delimited by the two channel regions 3 are provided in a predetermined region on the semiconductor layer. Since two MOS transistors are connected to each other in series in this exemplary embodiment, each impurity-doped region includes a source region 1004, a source/drain region 1005, and a drain region 1006. A second insulating layer (gate insulating film) 6 and a gate electrode 7 are formed on each channel region 3. As shown in FIG. 17, side-wall insulating layers 8 are formed on side walls of the gate electrode 7, and the MOS transistors are completely covered with an interlayer insulating film 14.

As shown in FIG. 16, N$^-$-type semiconductor layers having an impurity concentration which is lower than that in the source region 1004, the source/drain region 1005, and the drain region 1006 are formed as LDD regions 9 between the channel regions 3 and the source region 1004, between the channel region 3 and the source/drain region 1005, and between the channel region 3 and the drain region 1006.

In addition, first semiconductor regions 30 are provided at ends in the channel width direction of the source/drain region 1005 on the first insulating layer 2 along the channel length direction and P$^+$-type extracting regions (second semiconductor regions) 11 are provided on the first insulating layer 2 so that the first semiconductor regions 30 are sandwiched by the source/drain region 1005 and the extracting regions 11. The extracting regions 11 have an impurity concentration which is higher than that in the channel regions 3, and the first semiconductor regions 30 are of an N$^-$-type and have an impurity concentration which is substantially the same as that in the LDD regions 9.

In this exemplary embodiment, the extracting regions 11 are also provided at ends in the channel width direction of the source region 1004. As shown in FIG. 15, contact lines 12 which are common for the source region 1004 and the extracting regions 11 are provided over both the source region 1004 and the extracting regions 11. Since the source region 1004 and the extracting regions 11 are grounded in use, a contact line may be common to these regions in use. Since the source region 1004 and the extracting regions 11 have the same potential, a problem of the breakage voltage at the junction does not occur, and thus no first semiconductor regions 30 is necessary in this portion.

No extracting region 11 is provided at the ends in the channel width direction of the drain region 1006. Since the source region is fixed without exchange between the source and the drain in a logic circuit such as a NAND, it is sufficient that the extracting regions 11 are provided only at the grounded sides.

As shown in FIG. 17, the source region 1004 and the extracting regions 11 are electrically connected to a wiring layer 13 provided on the interlayer insulating film 14 via contact lines 12. The drain region 1006 is electrically connected to a wiring layer 18 provided on the interlayer insulating film 14 via a contact line 17.

Also in the semiconductor device including the MOS transistors connected in series of this exemplary embodiment, excessive carriers generated in the channel regions 3 are extracted to the exterior via the extracting regions 11, the contact lines 12, and the wiring layer 13.

Accordingly, a supporting substrate stray effect due to electrical stray of the channel regions may be prevented. Moreover, the first semiconductor regions 30 having the low impurity concentration are provided between the extracting regions 11 and the source/drain region 1005. Thus, breakage of the junctions between the extracting regions 11 and the source/drain region 1005 may be prevented at a drive voltage of approximately 15 volts, which is used in electro-optical devices such as liquid crystal displays.

Since a decrease in breakdown voltage at the junction between the extracting regions 11 and the source/drain region 1005 is prevented, a common body contact region may be provided for individual MOS transistors, even if the drive voltage is approximately 15 volts, and an effective layout may be employed.

Since the first semiconductor regions 30 are provided only in the source/drain region 1005, which is not directly connected to an electrical power supply, of each MOS transistor, the resulting semiconductor device has low resistance.

Since the common contact lines 12 are provided over the source region 1004 and the extracting region 11 and function as a contact for the source region 1004 and a contact for the extracting region 11, an effective layout is achieved.

Although the contact for the source region 1004 also functions as the contact for the extracting region 11 in this exemplary embodiment, two different contacts may be provided. Since a region having a low impurity concentration is not provided between the source region 1004 and the extracting region 11, it is preferable that these regions have the same potential when different contacts are provided.

Figure 19:
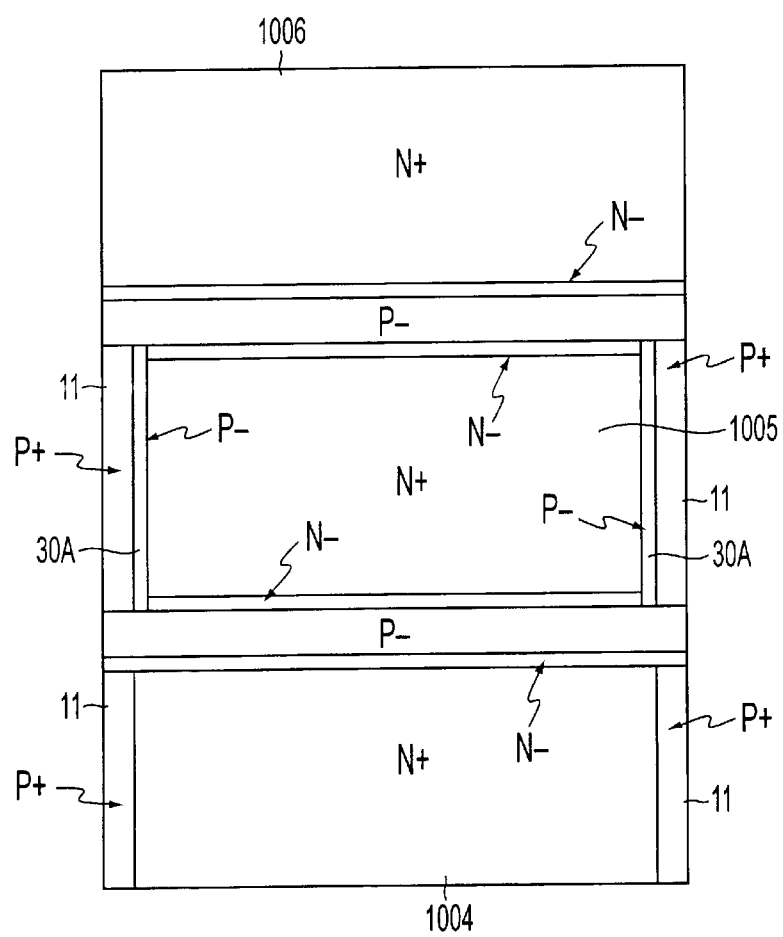
FIG. 19 shows another exemplary configuration on a face including source/drain regions in the semiconductor gate array.
Figure 20:
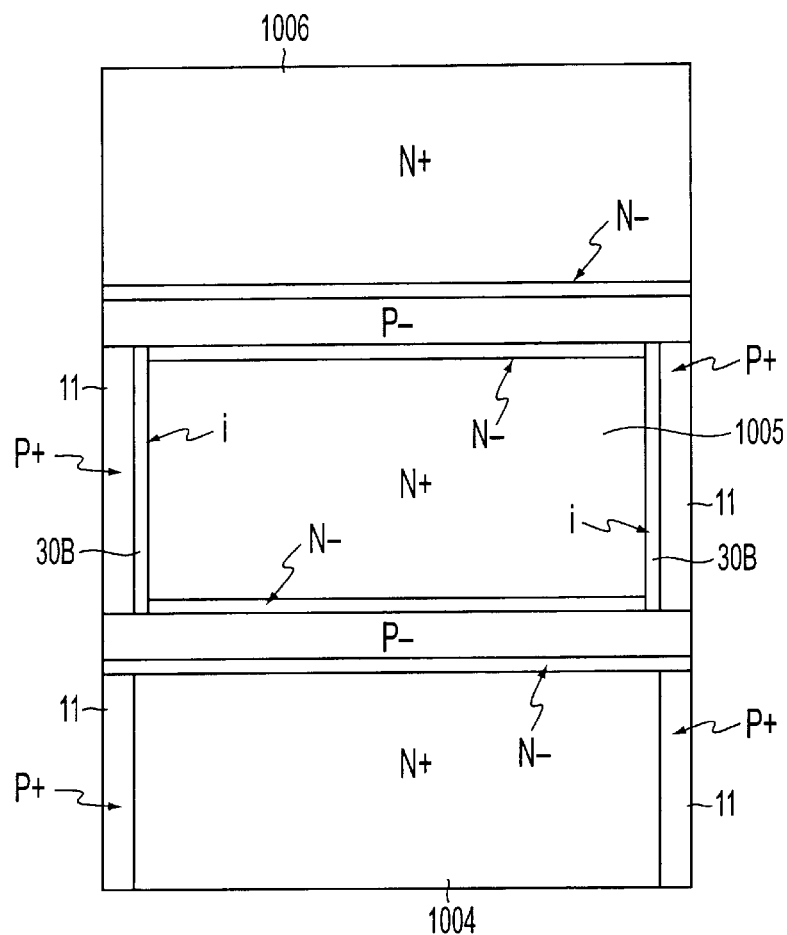
FIG. 20 shows another exemplary configuration on a face including source/drain regions in the semiconductor gate array.

Instead of the configuration in which the first semiconductor regions 30 are of the N$^-$-type and have an impurity concentration which is substantially the same as that in the LDD regions 9 in this exemplary embodiment, a configuration provided with first semiconductor regions 30A of a P$^-$-type having an impurity concentration which is substantially the same as that in the channel region 3, as shown in FIG. 19, and a configuration provided with first semiconductor regions 30B not substantially doped with an impurity, as shown in FIG. 20, are also applicable, as in the first and second embodiments. A configuration not provided with the first insulating layer 2 and a configuration not provided with the LDD regions 9 are also applicable to this exemplary embodiment, as in the first and second exemplary embodiments.

The third exemplary embodiment of the present invention is not limited to the NAND circuit and is also applicable to all logic circuits, each including a plurality of MOS transistors connected in series.

Fourth Exemplary Embodiment

Figure 21:
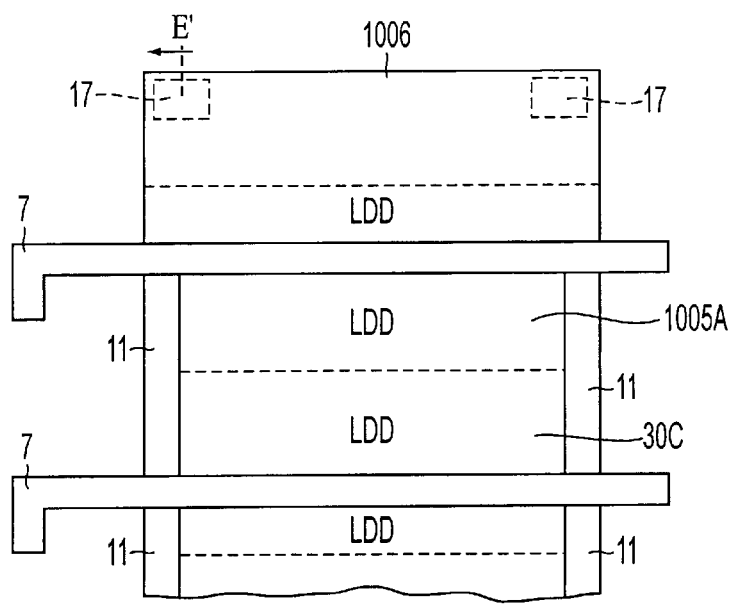
FIG. 21 is a plan view of a semiconductor device formed on a semiconductor layer on an insulating layer of another exemplary embodiment of the present invention in which an interlayer insulating film is omitted.

FIG. 21 is a modification of the semiconductor device of the third exemplary embodiment. In the exemplary embodiment shown in FIG. 21, the distance between gates of two MOS transistors connected in series is 3 μm and the width (size in the channel length direction) of the LDD region is 1.5 μm. Thus, a region to be a source/drain region 1005A of the two MOS transistors is doped with an impurity having a concentration (concentration as the LDD region) which is lower than that in the source/drain region 1005 in the third exemplary embodiment shown in FIG. 15. Thus, in the source/drain region 1005A in this exemplary embodiment, a first semiconductor region 30C for ensuring the breaking voltage at the junction to the extracting region 11 also functions as the LDD region having an impurity concentration which is lower than those in the usual source and drain regions.

In a typical example of sizes in this exemplary embodiment, the width (size in the channel width direction) of the extracting region 11 is 1 μm, the width (size in the channel length direction) of the LDD region is 1.5 μm (This is due to offset. In the third exemplary embodiment, the width is approximately 0.25 μm due to a side wall), and the ratio L (channel length)/W (channel width) of the MOS transistor is 5 μm/18 μm (20 μm when the width of the extracting region 11 is included). The thickness of a gate oxide film is 60 nm, and the thickness of a single-crystal silicon layer forming the semiconductor layer of the MOS transistor is 170 nm. Conditions of ion implantation in the formation of each semiconductor region include, for example, B$^+$ ion species, an implantation energy of 25 to 45 keV and preferably of 35 keV, and a dose of $5\times10^{11}$ to $7\times10^{11}$/cm$^2$ and preferably of $6\times10^{11}$/cm$^2$ for the channel region at the N-channel transistor side constituting a clocked inverter; P$^+$ ion species, an implantation energy of 60 to 80 keV and preferably of 70 keV, and a dose of $3\times10^{15}$ to $5\times10^{15}$/cm$^2$ and preferably of $4\times10^{15}$/cm$^2$ for the source/drain region; P$^+$ ion species, an implantation energy of 60 to 80 keV and preferably of 70 keV, and a dose of $5\times10^{12}$ to $7\times10^{12}$/cm$^2$ and preferably of $6\times10^{12}$/cm$^2$ for the LDD region (first semiconductor region); and BF$_2^+$ ion species, an implantation energy of 80 to 100 keV and preferably of 90 keV, and a dose of $1\times10^{15}$ to $3\times10^{15}$/cm$^2$ and preferably of $2\times10^{15}$/cm$^2$ for the extracting region.

On the other hand, at the P-channel transistor side, P$^+$ ion species, an implantation energy of 60 to 80 keV and preferably of 70 keV, and a dose of $1\times10^{11}$ to $3\times10^{11}$/cm$^2$ and preferably of $2\times10^{11}$/cm$^2$ for the channel region; BF$_2^+$ ion species, an implantation energy of 80 to 100 keV and preferably of 90 keV, and a dose of $1\times10^{15}$ to $3\times10^{15}$/cm$^2$ and preferably of $2\times10^{15}$/cm$^2$ for the source and drain regions; BF$_2^+$ ion species, an implantation energy of 80 to 100 keV and preferably of 90 keV, and a dose of $2\times10^{13}$ to $4\times10^{13}$/cm$^2$ and preferably of $3\times10^{13}$/cm$^2$ for the LDD region (first semiconductor region); and P$^+$ion species, an implantation energy of 60 to 80 keV and preferably of 70 keV, and a dose of $3\times10^{15}$ to $5\times10^{15}$/cm$^2$ and preferably of $4\times10^{15}$/cm$^2$ for the extracting region.

A clocked inverter was made based on this exemplary embodiment and normal operation was confirmed at a drive voltage of 15 volts.

Fifth Exemplary Embodiment

Figure 22:
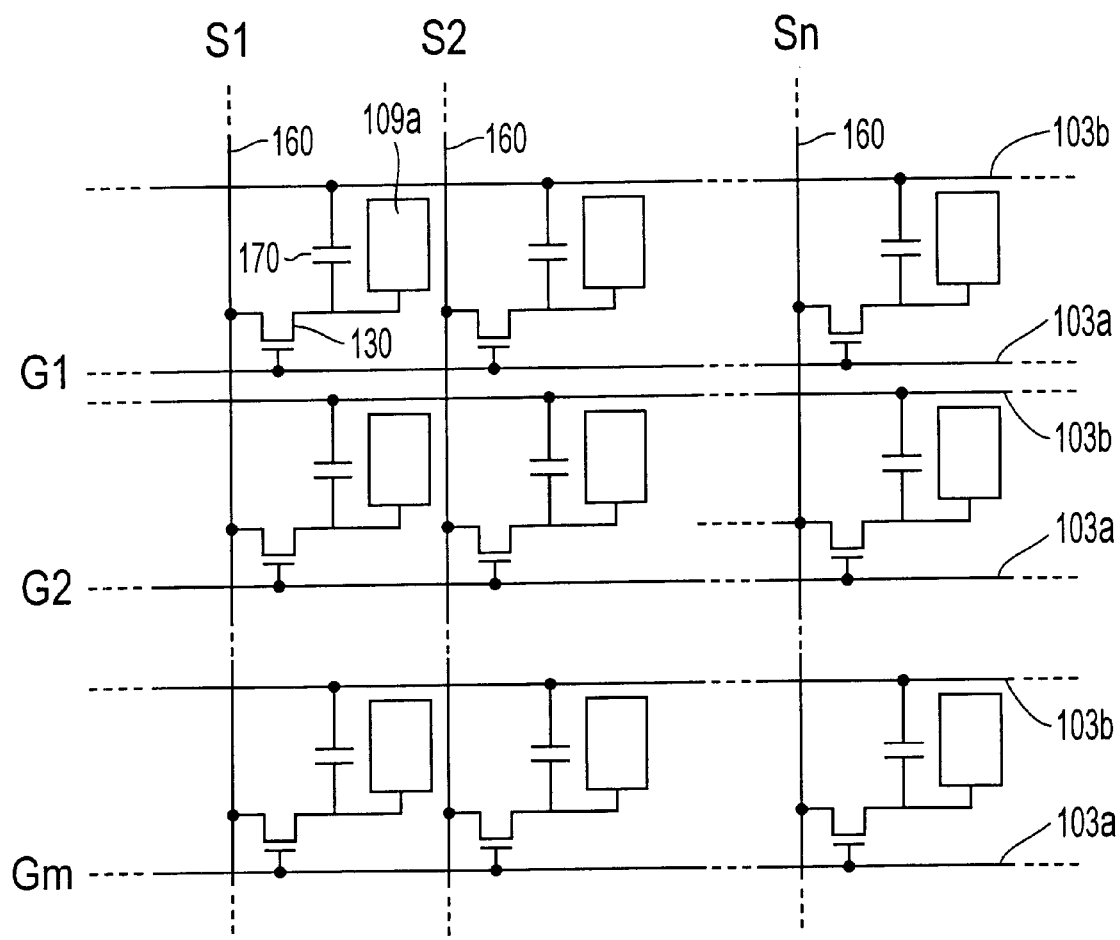
FIG. 22 is an equivalent circuit diagram of a liquid crystal device of another exemplary embodiment of the present invention.

A liquid crystal device 1000 using a thin film transistor (TFT) array substrate 10 according to any one of the first to fourth exemplary embodiment will be described with reference to FIGS. 22 to 24. FIG. 22 is an equivalent circuit diagram of a plurality of pixels including various elements and lines which constitute an image display region of the liquid crystal device in this exemplary embodiment, FIG. 23 is a plan view of the TFT array substrate 10 and each components formed thereon when viewed from a opposite substrate 20 side, and FIG. 24 is a cross-sectional view which includes the opposite substrate 20 and is taken along line XXIV–XXIV' in FIG. 23.

In the liquid crystal device in this exemplary embodiment, as shown in FIG. 22, a plurality of pixels are arranged in a matrix and constituting an image display region. Pixel electrodes 109a and TFTs 130 for controlling the pixel electrodes 109a are arranged in a matrix. Data lines (signal lines) 160 for supplying image signals are electrically connected to source regions of the TFTs 130. Image signals S1, S2, . . . , Sn may be supplied to the data lines 160, in that order, or a group of image signals may be supplied to a plurality of adjacent data lines 160. Scanning lines (signal lines) 103a are electrically connected to gate electrodes of the TFTs 130 so that pulse scanning signals G1, G2, . . . , Gm are supplied to the scanning lines 103a at a predetermined timing, in that order. Pixel electrodes 109a are electrically connected to the drain regions of the TFTs 130 and the switches of the TFTs 130 as switching elements are closed at a predetermined time so that the image signals S1, S2, . . . , Sn supplied from the data lines 160 are input at a predetermined timing.

The image signals S1, S2, . . . , Sn input to the liquid crystal from the pixel electrodes 109a are maintained between the pixel electrodes 109a and counter electrodes (described below) formed on the opposite substrate (described below) at a predetermined time. In order to prevent leakage of the maintained image signals, accumulation capacitor sections 170 are incorporated in parallel to liquid crystal capacitors formed between the pixel electrodes 109a and the counter electrodes. Numeral 103b represents capacitor lines which constitute upper electrodes. Accumulation capacitor sections 170 allows the voltage of the pixel electrodes 109a to be maintained for a time which is thousand times longer than the time for applying the source voltage. Thus, the liquid crystal device has further improved maintaining characteristics and higher contrast. In order to provide accumulation capacitor sections, the proceeding scanning line instead of a capacitor line may be used for forming a capacitor.

Figure 23:
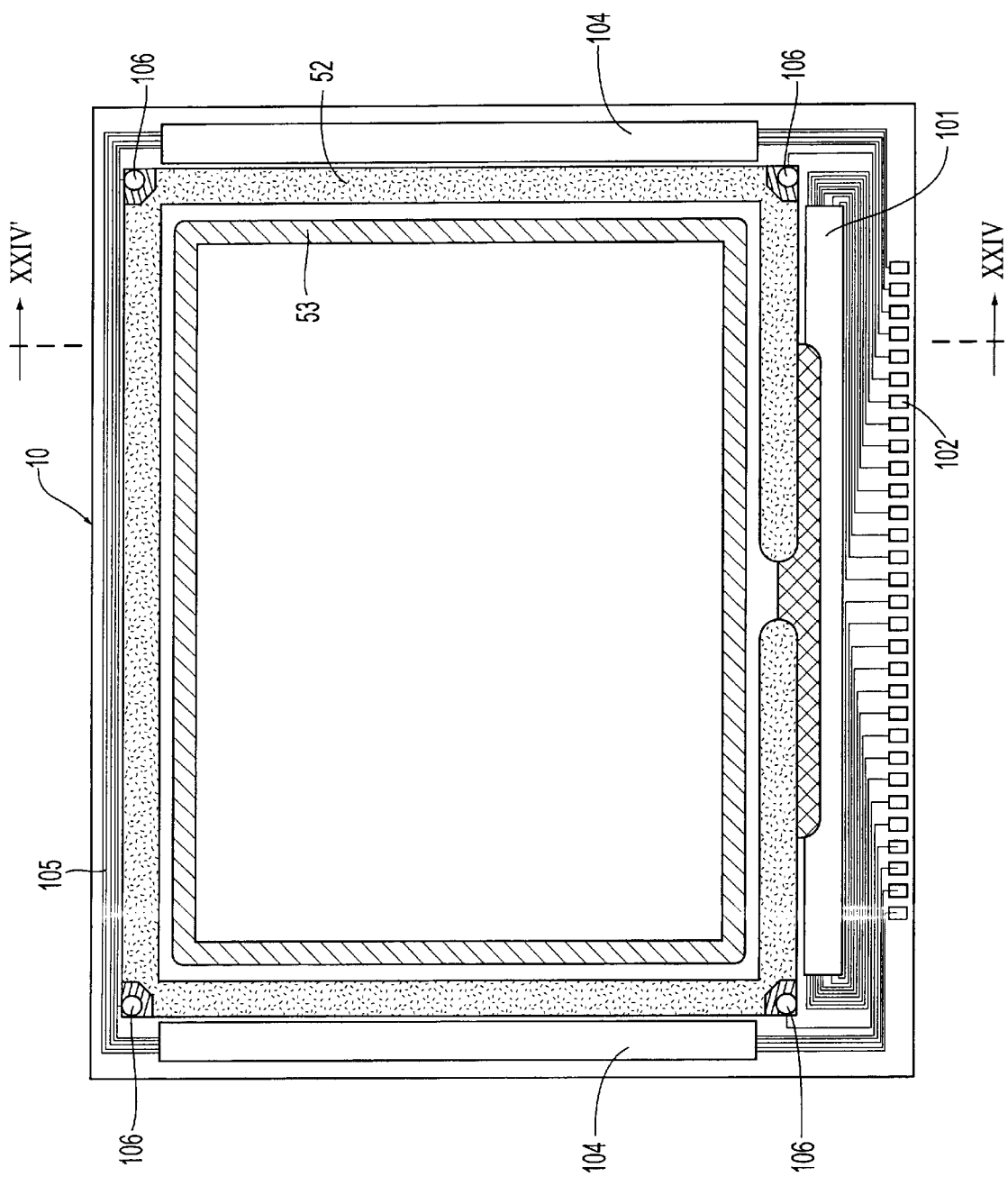
FIG. 23 is a plan view, from a opposite substrate side, of a TFT array substrate including components formed thereon of the liquid crystal device of the present invention.
Figure 24:
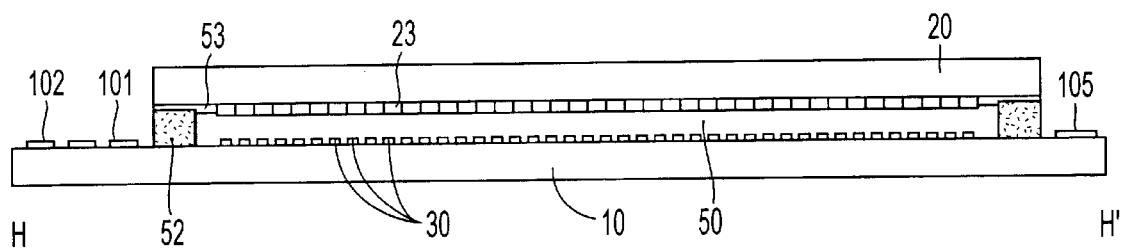
FIG. 24 is a cross-sectional view taken along line XXIV–XXIV' in FIG. 23.

In FIG. 23, a sealant 52 is provided along the edges of the TFT array substrate 10, and a peripheral parting film 53 is provided therein. In the exterior of the sealant 52, a data line driving circuit 101 and a mounting terminal 102 are provided along one side of the TFT array substrate 10, and scanning line driving circuits 104 are provided along two sides adjacent to the above side. If the delay of scanning signals supplied to the scanning lines is not to be considered, a scanning line driving circuit 104 may be provided along only one side. Alternatively, data line driving circuits 101 may be arranged along two sides of the image display region. For example, in a preferred exemplary embodiment, data lines of odd rows supply image signals from a data line driving circuit along one side of the image display region, whereas data lines of even rows supply image signals from another data line driving circuit along the opposite side of the image display region. Such alternate driving of the data lines can expand the areas for the data line driving circuits, and thus complicated circuits may be provided. Along the residual side of the TFT array substrate 10, a plurality of lines 105 is provided so that the scanning line driving circuits 104 provided at both sides of the image display region are connected to each other. At least at a corner of the opposite substrate 20, an upright conductor 106 is provided so that the TFT array substrate 10 is electrically connected to the opposite substrate 20. As shown in FIG. 24, the opposite substrate 20 has substantially the same contour as that of the sealant 52 shown in FIG. 23, and is bonded to the TFT array substrate 10 via the sealant 52.

The TFT array substrate 10 of the liquid crystal device may be further provided with an inspection circuit and the like for inspecting the quality and defects of the liquid crystal device during the production and shipment. Instead of providing the data line driving circuit 101 and the scanning line driving circuit 104 on the TFT array substrate 10, for example, these circuits may be electrically and mechanically connected to a driving LSI mounted in a TAB (tape automated bonding supporting substrate) via an anisotropic conductive film provided in a peripheral section of the TFT array substrate 10. On a side of the opposite substrate 20 on which projected light is incident and a side of the TFT array substrate 10 from which light is emitted, polarization films, retardation films, and/or polarization devices are arranged in predetermined directions according to operational modes, such as a TN (twisted nematic) mode, a STN (super TN) mode, and a D-STN (dual scan-STN) mode, and types, such as a normally white mode and a normally black mode.

Three liquid crystal devices are used as RGB light valves when the above-described liquid crystal device is employed in a color liquid crystal projector (projective display), and RGB color lights decomposed by dichroic mirrors are incident on these panels, respectively. In such a case, therefore, the opposite substrate 20 is not provided with a color filter, as described in the above exemplary embodiment. Instead, the opposite substrate 20 may be provided with RGB color filters and protective films in predetermined regions opposing to the pixel electrodes. This liquid crystal device having such a configuration may be applied to color liquid crystal displays other than liquid crystal projectors, such as direct viewing and reflective color liquid crystal televisions. Moreover, microlenses may be provided on the opposite substrate 20 so that each microlens corresponds to each pixel. This configuration improves collection efficiency of the incident light, and achieves a bright liquid crystal device. In addition, a dichroic filter for forming RGB color by interference of light may be formed on the opposite substrate 20 by depositing interference layers having different refractive indices. The opposite substrate provided with the dichroic filter can achieve a brighter liquid crystal device.

Sixth Exemplary Embodiment

Figure 25:
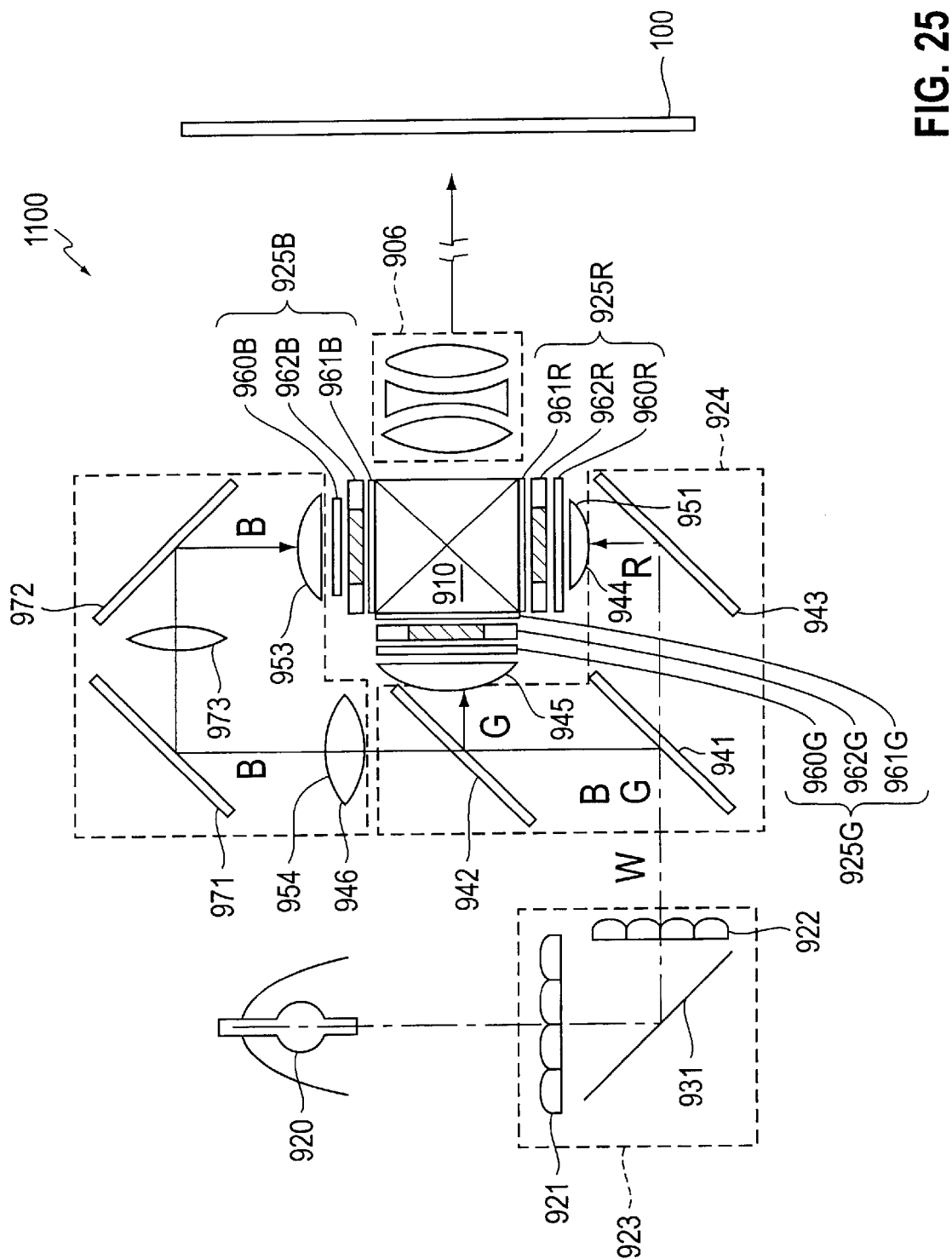
FIG. 25 is a schematic view of a projection display device as an example of electronic equipment using the liquid crystal device of the present invention.

A configuration of a projection display device will be described with reference to FIG. 25, as an example of electronic devices using the above liquid crystal device. FIG. 25 is a schematic diagram of an optical system of a projection display device 1100 including three liquid crystal devices described above which are used as a red liquid crystal device 962R, a green liquid crystal device 962G, and blue liquid crystal device 962B. The optical system of the projection display device of this exemplary embodiment includes a light source unit 920 and a uniformly illuminating optical system 923. Moreover, the projection display device 1100 is provided with a color separating optical system 924 which decomposes a white light beam W emitted from the uniformly illuminating optical system 923 into a red (R) beam, a green (G) beam, and a blue (B) beam; three light valves 925R, 925G, and 925B which modulate the R, G, and B light beams, respectively; a prism unit 910 as a color synthesizing device which resynthesizes modulated color light beams; and a projection lens unit 906 as a projection device which enlarges and projects the synthesized light beams onto a projection screen 100. The projection display device 1100 is further provided with a light guide system 927 which conducts the blue light beam B to the corresponding light valve 925B.

The uniformly illuminating optical system 923 is provided with two lens plates 921 and 922 and a mirror 931 disposed between the two lens plates 921 and 922 which are orthogonally arranged. Each of the two lens plates 921 and 922 of the uniformly illuminating optical system 923 is composed of a plurality of rectangular lenses arranged in a matrix. The light beams emitted from the light source unit 920 are divided into a plurality of light beam fragments by the rectangular lenses of the first lens plate 921. These light beam fragments are superimposed by the rectangular lenses of the second lens plate 922 in the vicinity of the three light valves 925R, 925G, and 925B. Accordingly, the use of the uniformly illuminating optical system 923 allows illumination of the three light valves 925R, 925G, and 925B by uniform illumination light, even if the light source unit 920 has an uneven illumination distribution in a cross-section of the emitted light beams.

The color separating optical system 924 includes a blue/green reflective dichroic mirror 941, a green reflective dichroic mirror 942, and a reflective mirror 943. The blue/green reflective dichroic mirror 941 orthogonally reflects the blue light beam B and the green light beam G toward the green reflective dichroic mirror 942. The red light beam R passes through the blue/green reflective dichroic mirror 941, is orthogonally reflected by the reflective mirror 943, and is emitted from an emitting section 944 for the red light beam R toward the prism unit 910.

The green reflective dichroic mirror 942 orthogonally reflects only the green light beam G reflected by the blue/ green reflective dichroic mirror 941 toward an emitting section 945 for the green light beam G and the color synthesizing optical system. The blue light beam B passes through the green reflective dichroic mirror 942 and is emitted from the emitting section 946 for the blue light beam B toward the light guide system 927. In this exemplary embodiment, distances from the emitting section of the white light beam W in the uniformly illuminating optical system 923 to the emitting sections 944, 945, and 946 for the three color light beams in the color separating optical system 924 are substantially the same.

Collimating lenses 951 and 952 are disposed at emitting sides of the emitting section 944 for the red light beam R and the emitting section 945 for the red light beam G, respectively, in the color separating optical system 924. Thus, the red light beam R and the green light beam G emitted from the emitting sections are incident on and collimated by these collimating lenses 951 and 952.

The collimated red light beam R and green light beam G are incident on and modulated by the light valves 925R and 925G, respectively, according to image information for these colors. That is, these liquid crystal devices are switch-controlled by a driving system (not shown in the drawing) according to the image information so that color light beams which pass through the liquid crystal devices are modulated. On the other hand, the blue light beam B is introduced to the light valve 925B via the light guide system 927, and is modulated according to the image information. The light valves 925R, 925G, and 925B in this exemplary embodiment are liquid crystal light valves including incident-side polarizers 960R, 960G, and 960B, respectively, emitting-side polarizers 961R, 961G, and 961B, respectively, and liquid crystal devices 962R, 962G, and 962B, respectively, disposed therebetween.

The light guide system 927 includes a converging lens 954 disposed at the emitting side of the emitting section 946 for the blue light beam B, an incident-side mirror 971, an emitting-side mirror 972, an intermediate lens 973 disposed between these mirrors, and a converging lens 953 disposed in front of the light valve 925B. The blue light beam B emitted from the converging lens 954 is introduced to the blue liquid crystal device 962B via the light guide system 927 to be modulated. Since the optical path of the blue light beam B from the emitting section of the white light beam W to the blue liquid crystal device 962B is the maximum in three optical paths to the three liquid crystal devices 962R, 962G, and 962B, the intensity loss of the blue light beam B is most significant. The light guide system 927, however, can suppress such intensity loss.

Color light beams R, G, and B modulated in the light valves 925R, 925G, and 925B, respectively, are incident on and synthesized in the prism unit 910. The synthesized light by the prism unit 910 is enlarged and projected by the projection lens unit 906 on the projection screen 100 placed at a predetermined position.

In the liquid crystal devices 962R, 962G, and 962B of this exemplary embodiment, a light-shielding layer is provided below the TFT. This configuration can sufficiently shield the return light from the channels of the TFTs for switching the pixel electrodes, even when the light reflected by the projection optical system in the liquid crystal projector based on the light which is projected from the liquid crystal devices 962R, 962G, and 962B, the light reflected by the surface of the TFT array substrate when the projected light passes through, and the light which is emitted from other liquid crystal devices and passes through the projection optical system are incident on the TFT array substrate side as return light.

If a prism unit suitable for a compact system is used in the projection optical system, providing an additional film for preventing the return light between the liquid crystal devices 962R, 962G, and 962B and the prism unit or a treatment of the polarizers for preventing the return light is unnecessary. Thus, the system configuration is compact and simplified.

In this exemplary embodiment, the effects of the return light on the channel regions of the TFTs are suppressed. Thus, it is not necessary to bond the polarizers 961R, 961G, and 961G which are subjected to a treatment for preventing return light directly to the liquid crystal devices. As shown in FIG. 25, the polarizers may be detached from the liquid crystal devices, that is, the polarizers 961R, 961G, and 961B may be bonded to the prism unit 910, whereas the other polarizers 960R, 960G, and 960B may be bonded to the converging lenses 944, 945, and 953, respectively. By bonding these polarizers to the prism unit and the converging lenses, the prism unit and the converging lenses absorb the heat from the polarizers and thus prevent temperature rise of the liquid crystal devices.

As not shown in the drawing, air layers are formed between the liquid crystal devices and the polarizers which are detached from the liquid crystal devices. When a cooling system is provided to feed cooling air between the liquid crystal devices and the polarizers, the temperature rise of the liquid crystal devices may be more effectively prevented, and thus malfunction of the liquid crystal devices due to the temperature rise may be prevented.

Although this exemplary embodiment is illustrated with reference to the liquid crystal device, this exemplary embodiment is also applicable to electro-optical devices, such as electroluminescent displays and plasma displays.

As described above, according to the present invention, a semiconductor region having a low impurity concentration for extracting excessive carriers which are accumulated in the channel region is provided between the extracting region and the source/drain regions. Thus, the resulting semiconductor device has a high breakdown voltage at the junctions and the extracting region and the source/drain regions.

Also according to the present invention, a semiconductor gate array including a plurality of the semiconductor devices is obtainable.

According to the present invention, a semiconductor device including a plurality of MOS transistors which are connected to each other in series is also obtainable.

What is claimed is:

1. A semiconductor device, comprising:
   a supporting substrate having insulation at least at a surface thereof;
   a semiconductor layer formed on the surface of the supporting substrate;
   a transistor formed in the semiconductor layer, the transistor comprising a channel region of a first conductive type formed on the surface of the supporting substrate, a source region and a drain region of a second conductive type formed on the surface of the supporting substrate so as to sandwich the channel region, an insulating layer formed on the channel region, and an electrode formed on the insulating layer;
   a first semiconductor region provided on the surface of the supporting substrate at least at one end in a channel width direction along both of the source region and the drain region;
   a second semiconductor region of the first conductive type provided on the surface of the supporting substrate so as to sandwich the first semiconductor region by the source region and the drain region along the first semiconductor region, the second semiconductor region having an impurity concentration which is higher than that in the channel region, and the first semiconductor region having an impurity concentration which is lower than that in the source region and the drain region and is lower than that in the second semiconductor region; and an LDD region of the second conductive type formed between the channel region and the source region and between the channel region and drain region, the first semiconductor region being a semiconductor of the second conductive type and having an impurity concentration which is the same as that in the LDD region.

2. The semiconductor device according to claim 1, the first semiconductor region being a semiconductor of the second conductive type, and having an impurity concentration which is lower than that in the source region and the drain region.

3. The semiconductor device according to claim 1, the supporting substrate having insulation at least at a surface thereof comprising a base substrate and an insulating layer formed on the base substrate.

4. The semiconductor device according to claim 3, the base substrate comprising single-crystal silicon.

5. The semiconductor device according to claim 3, the base substrate comprising quartz, and the semiconductor layer formed on the insulating layer of the supporting substrate comprising single-crystal silicon.

6. The semiconductor device according to claim 3, the base substrate comprising quartz, and the semiconductor layer formed on the insulating layer of the supporting substrate comprising polycrystalline silicon.

7. The semiconductor device according to claim 3, the base substrate comprising glass.

8. An electro-optical device, comprising:
the supporting substrate constituting the semiconductor device according to claim 1 as a first support substrate;
a second supporting substrate facing the semiconductor layer formed on the insulating layer on the first supporting substrate; and
a liquid crystal disposed between the first supporting substrate and the second supporting substrate, and driven by transistor elements in the semiconductor layer.

9. An electronic equipment, comprising:
a light source;
the electro-optical device according to claim 8 that modulates light incident on the light source in response to image information; and
a projection device that projects the light modulated by the electro-optical device.

10. A semiconductor gate array, comprising:
a supporting substrate having insulation at least at a surface thereof;
a semiconductor layer formed on the surface of the supporting substrate;
a plurality of transistors formed in the semiconductor layer, each of the transistors comprising a channel region of a first conductive type formed on the surface of the supporting substrate, a source region and a drain region of a second conductive type formed on the surface of the supporting substrate so as to sandwich the channel region, an insulating layer formed on the channel region, and an electrode formed on the insulating layer;

a first semiconductor region provided on the surface of the supporting substrate at least at one end in a channel width direction along both of the source region and the drain region;

a second semiconductor region of the first conductive type provided on the surface of the supporting substrate so as to sandwich the first semiconductor region by the source region and the drain region along the first semiconductor region, the second semiconductor region having an impurity concentration which is higher than that in the channel region, and the first semiconductor region having an impurity concentration which is lower than that in the source region and the drain region and is lower than that in the second semiconductor region; and an LDD region of the second conductive type formed between the channel region and the source region and between the channel region and drain region, the first semiconductor region of each transistor being a semiconductor of the second conductive type and having an impurity concentration which is the same as that in the LDD region.

11. The semiconductor gate array according to claim 10, the first semiconductor region of each transistor being a semiconductor of the second conductive type, and having an impurity concentration which is lower than that in the source region and the drain region.

12. A semiconductor gate array according to claim 10, the supporting substrate having insulation at least at a surface thereof comprising a base substrate and an insulating layer formed on the base substrate.

13. The semiconductor gate array according to claim 12, the base substrate comprising single-crystal silicon.

14. The semiconductor gate array according to claim 12, the base substrate comprising quartz, and the semiconductor layer formed on the insulating layer of the supporting substrate comprising single-crystal silicon.

15. The semiconductor gate array according to claim 12, the base substrate comprising quartz, and the semiconductor layer formed on the insulating layer of the supporting substrate comprising polycrystalline silicon.

16. The semiconductor gate array according to claim 12, the base substrate comprising glass.

17. An electro-optical device, comprising:
the supporting substrate constituting the semiconductor gate array according to claim 15 as a first supporting substrate;
a second supporting substrate facing the semiconductor layer formed on the insulating layer on the first supporting substrate; and
a liquid crystal disposed between the first supporting substrate and the second supporting substrate, and driven by transistor elements in the semiconductor layer.

18. An electronic equipment, comprising:
a light source;
the electro-optical device according to claim 17 that modulates light incident on the light source in response to image information; and
a projection device that projects the light modulated by the electro-optical device.

19. A semiconductor device of claim 1, wherein the second semiconductor region is connected to a wiring via a first contact, and one of the source region and the drain region is connected to another wiring via a second contact.

20. A semiconductor gate array, comprising:

a supporting substrate having insulation at least at a surface thereof;

a semiconductor layer formed on the surface of the supporting substrate;

a plurality of MOS transistors formed in the semiconductor layer, each of the MOS transistors comprising a channel region of a first conductive type formed on the surface of the supporting substrate, a source region and a drain region of a second conductive type formed on the surface of the supporting substrate so as to sandwich the channel region, an insulating layer formed on the channel region, and an electrode formed on the insulating layer;

a first semiconductor region provided on the surface of the supporting substrate at least at one end in a channel width direction along both of the source region and the drain region;

a second semiconductor region of the first conductive type provided on the surface of the supporting substrate so as to sandwich the first semiconductor region by the source region and the drain region along the first semiconductor region, the second semiconductor region having an impurity concentration which is higher than that in the channel region, and the first semiconductor region having an impurity concentration which is lower than that in the source region and the drain region and is lower than that in the second semiconductor region; and an LDD region of the second conductive type formed between the channel region and the source region and between the channel region and drain region, the first semiconductor region being a semiconductor of the second conductive type and having an impurity concentration which is the same as that in the LDD region.

* * * * *